United States Patent
Ohata et al.

(10) Patent No.: US 11,618,060 B2
(45) Date of Patent: Apr. 4, 2023

(54) ULTRASONIC CLEANING APPARATUS AND ULTRASONIC CLEANING SYSTEM

(71) Applicant: KAIJO CORPORATION, Hamura (JP)

(72) Inventors: Keisuke Ohata, Hamura (JP); Noriyuki Sakamoto, Hamura (JP)

(73) Assignee: KAIJO CORPORATION, Tokyo (JP)

(*) Notice: Subject to any disclaimer, the term of this patent is extended or adjusted under 35 U.S.C. 154(b) by 110 days.

(21) Appl. No.: 16/344,585

(22) PCT Filed: Aug. 21, 2018

(86) PCT No.: PCT/JP2018/030784
§ 371 (c)(1),
(2) Date: Apr. 24, 2019

(87) PCT Pub. No.: WO2019/082483
PCT Pub. Date: May 2, 2019

(65) Prior Publication Data
US 2021/0331215 A1   Oct. 28, 2021

(30) Foreign Application Priority Data

Oct. 25, 2017   (JP) .............................. JP2017-206352

(51) Int. Cl.
*B08B 3/12*   (2006.01)
*B08B 3/04*   (2006.01)

(52) U.S. Cl.
CPC .............. *B08B 3/123* (2013.01); *B08B 3/041* (2013.01); *B08B 2240/00* (2013.01)

(58) Field of Classification Search
CPC ........... B08B 3/12; B08B 3/123; B08B 3/022; B08B 3/041
See application file for complete search history.

(56) References Cited

U.S. PATENT DOCUMENTS 6,021,785 A * 2/2000 Grutzediek ....... H01L 21/67051
257/E21.228
6,230,722 B1 * 5/2001 Mitsumori .............. B08B 3/123
134/186

FOREIGN PATENT DOCUMENTS

JP   H03258381 A   11/1991
JP   H03259523 A   11/1991
(Continued)

OTHER PUBLICATIONS

JP2009061359—Machine Translation (Year: 2009).*
KR101336996—Machine Translation (Year: 2013).*
(Continued)

*Primary Examiner* — Marc Lorenzi
(74) *Attorney, Agent, or Firm* — Buchanan Ingersoll & Rooney PC

(57) ABSTRACT

An ultrasonic cleaning apparatus capable of cleaning large-sized objects includes: a casing having a bottom surface that forms a tilted surface to oppose the object to be cleaned and having an ultrasonic transducer provided at an inner lower surface; a cleaning liquid supply device configured to supply cleaning liquid to a casing bottom surface; and a flow-speed accelerator that ejects the cleaning liquid by accelerating the flow speed of the cleaning liquid from the cleaning liquid supply device. The casing is formed by a main body including an upper plate, a projected part attached to a lower part of the upper plate, an outer lateral face extended from the projected part in a downward direction, and the bottom surface connected integrally at a lower end part of the outer lateral face. The bottom surface is formed to be tilted at a prescribed angle with respect to a horizontal plane.

7 Claims, 11 Drawing Sheets

(56) References Cited

FOREIGN PATENT DOCUMENTS

| | | | |
|---|---|---|---|
| JP | H08168730 A | | 7/1996 |
| JP | H10296199 A | | 11/1998 |
| JP | H11340192 A | | 12/1999 |
| JP | 2001000933 A | | 1/2001 |
| JP | 2001198538 A | | 7/2001 |
| JP | 2003181394 A | * | 7/2003 |
| JP | 2003320330 A | | 11/2003 |
| JP | 2005-013809 A | | 1/2005 |
| JP | 2005085978 A | | 3/2005 |
| JP | 2005131602 A | | 5/2005 |
| JP | 2009061359 A | | 3/2009 |
| JP | 2009061359 A | * | 3/2009 |
| JP | 2014000553 A | | 1/2014 |
| KR | 101336996 B1 | | 12/2013 |
| KR | 1020150109203 A | | 10/2015 |
| TW | 200507956 A | | 3/2005 |
| TW | I464019 B | | 12/2014 |

OTHER PUBLICATIONS

JP2003181394—Machine Translation (Year: 2003).*
International Search Report (PCT/ISA/210) dated Nov. 13, 2018, by the Japan Patent Office as the International Searching Authority for International Application No. PCT/JP2018/030784.
Taiwanese Office Action dated Apr. 9, 2019, issued by the Taiwan Patent Office in corresponding Taiwan Patent Application No. 107128949.
Written Opinion (PCT/ISA/237) dated Nov. 13, 2018, by the Japan Patent Office as the International Searching Authority for International Application No. PCT/JP2018/030784.
Written Opinion dated Oct. 19, 2020, by the Intellectual Property Office of Singapore in corresponding Singapore Patent Application No. 11202000910Y. (7 pages).

* cited by examiner

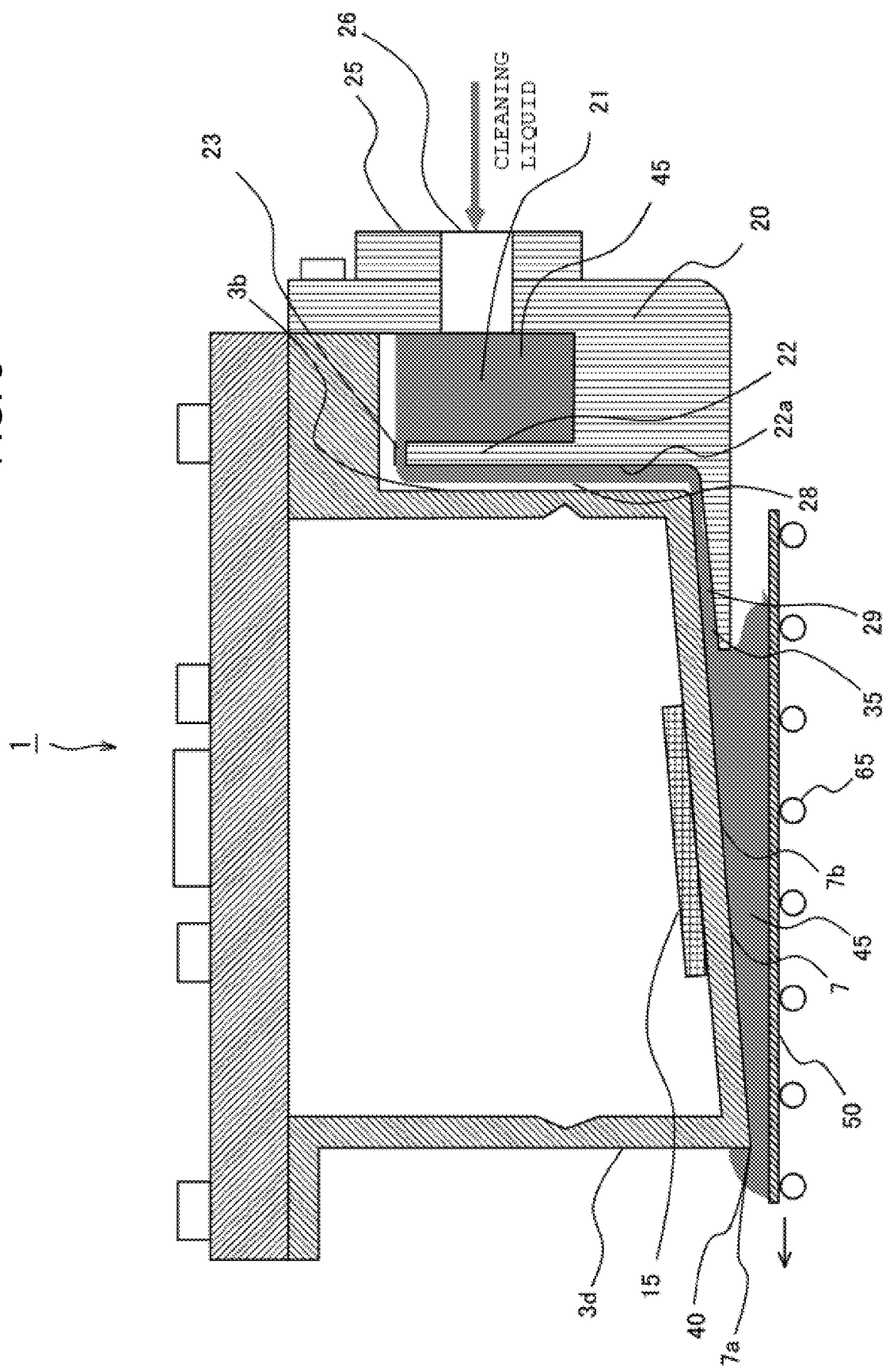

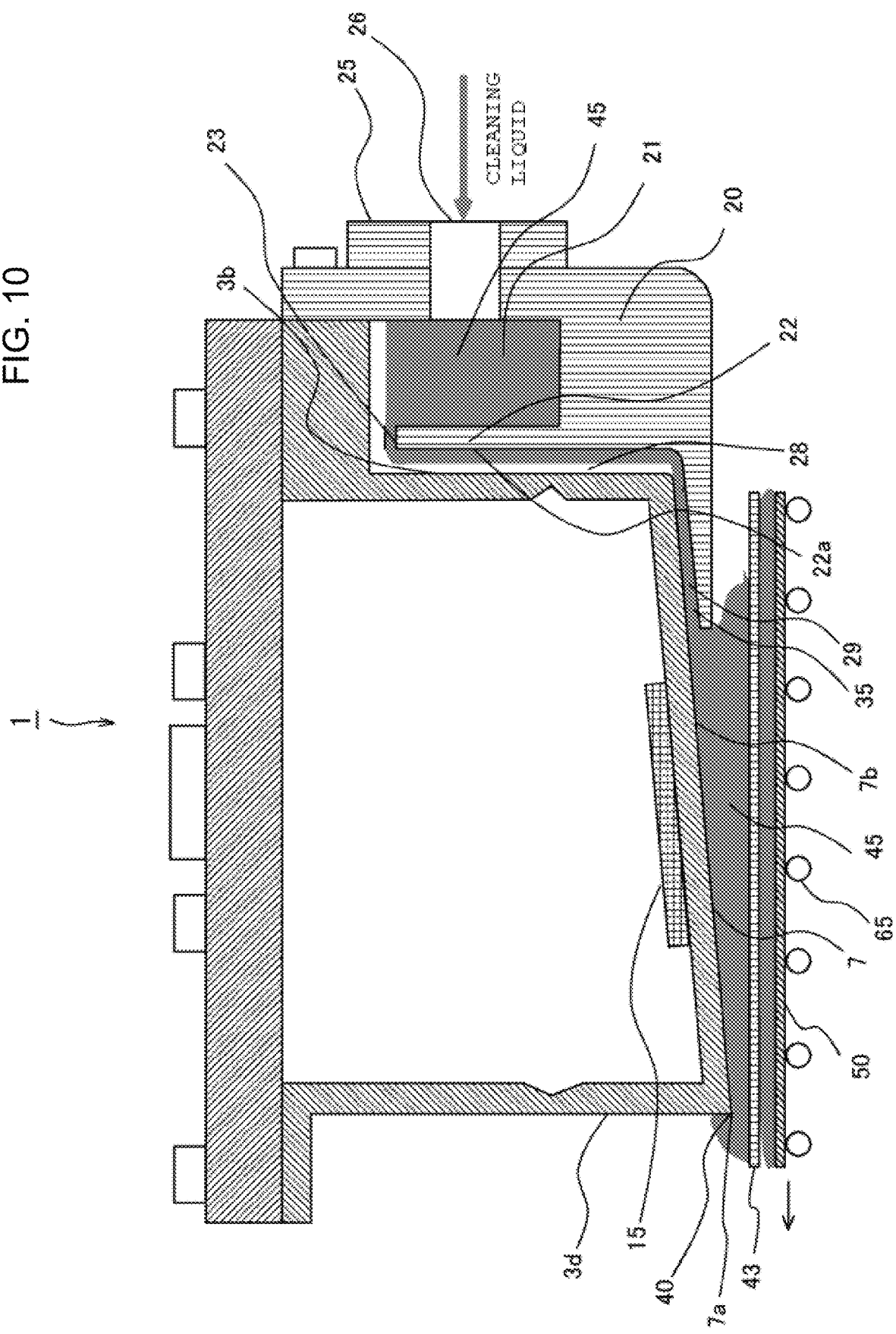

ULTRASONIC CLEANING APPARATUS AND ULTRASONIC CLEANING SYSTEM

BACKGROUND OF THE INVENTION

Field of the Invention

The present invention relates to an ultrasonic cleaning apparatus and an ultrasonic cleaning system configured to perform ultrasonic cleaning of objects to be cleaned such as semiconductor substrates formed with wafers and glass substrates, for example, and flexible films, and the like. More specifically, the present invention relates to an ultrasonic cleaning apparatus and an ultrasonic cleaning system capable of performing line shower type or horn type cleaning and capable of saving liquid by greatly reducing the cleaning liquid to be used.

Description of the Related Art

Conventionally, it is typical with an ultrasonic cleaning apparatus to perform cleaning by attaching an ultrasonic transducer to a lower surface of a cleaning tank, supplying a cleaning liquid to the cleaning tank, immersing an object to be cleaned into the cleaning tank, and applying ultrasonic vibration from the lower surface of the cleaning tank. Further, also performed is transducer-insertion type cleaning by inserting an ultrasonic transducer built in a main body of a watertight structure into the cleaning liquid.

For cleaning liquid crystal panels, semiconductor wafers, and the like, known is a shower type ultrasonic cleaning apparatus that performs ultrasonic cleaning of those objects to be cleaned by ejecting a cleaning liquid in a shower-like form along with ultrasonic wave.

In Japanese Patent Laid Open Publication No. 2001-933, disclosed is a shower type ultrasonic cleaning apparatus of easy placement adjustment, which requires no strict distance adjustment from a nozzle leading end to an object to be cleaned.

The shower type ultrasonic cleaning apparatus according to Japanese Patent Laid Open Publication No. 2001-933 includes a nozzle attached at a leading end part of a casing, a disc-shaped ultrasonic transducer disposed by opposing to a rear end part of the nozzle, and a supply port of a cleaning liquid formed on a lateral face of the casing, in which a discharge port of the nozzle is formed such that diameter thereof is formed in a prescribed straight-line round hole, and a rear edge surface of the nozzle is formed in a conic shape descending at a prescribed tilt angle from an outer fringe of the rear edge surface toward the discharge port. The cleaning liquid supplied from the liquid supply port and the ultrasonic wave emitted from the ultrasonic transducer are sprayed from the leading end of the nozzle to clean the object to be cleaned disposed in front of the nozzle. Thus, the ultrasonic wave emitted from the nozzle does not form a focal point, so that it is not necessary to strictly adjust the distance from the object to be cleaned to the nozzle leading end.

As described above, the shower type ultrasonic cleaning apparatus including the line type irradiates an ultrasonic energy to the supplied cleaning liquid by the ultrasonic transducer inside the casing and sprays the cleaning liquid to which the ultrasonic wave is applied from the nozzle to remove particles and the like.

Further, in Japanese Patent Laid Open Publication No. 2005-85978, disclosed is a horn type single-wafer cleaning device capable of performing flexibly selectable cleaning in accordance with extent of contamination with the particles even when the object to be cleaned is the semiconductor wafer or other object to be cleaned than the semiconductor wafer.

Japanese Patent Laid Open Publication No. 2005-85978 is configured with: a rotary table that supports one face of an object to be cleaned; a plurality of transducers that vibrate at different frequencies and are counter-disposed on another face of the object to be cleaned supported by the rotary table; a liquid supply nozzle that supplies the cleaning liquid between the transducers and the object to be cleaned; a motor that translates the rotary table in parallel to the transducer faces; and an ultrasonic generator that ultrasonic-vibrates the transducers at different frequencies.

The single-wafer cleaning apparatus cleans the object to be cleaned face with the interposed cleaning liquid by ultrasonic-vibrating the transducers while translating the object to be cleaned supported to the rotary table.

As described, the horn type single-wafer cleaning apparatus (hereinafter, referred to as horn type ultrasonic cleaning apparatus) performs cleaning by forming a liquid film between the vibration surfaces and the object to be cleaned and directly propagating the ultrasonic wave energy to the object to be cleaned via the liquid film to remove the particles.

Further, in Japanese Patent Laid Open Publication H03-258381, disclosed is a horn type ultrasonic cleaner that includes: an ultrasonic transducer provided with a prescribed gap kept by giving a prescribed angle with respect to a cleaning surface of an object to be cleaned; and a medium supply tube disposed in the vicinity of the ultrasonic transducer, in which a medium is discharged from the medium supply tube to form a layer of the medium between the vibration surface of the ultrasonic transducer and the cleaning surface of the object to be cleaned so as to apply the ultrasonic vibration to the object to be cleaned via the layer of the medium.

SUMMARY OF INVENTION

The shower type ultrasonic cleaning apparatus disclosed in Japanese Patent Laid Open Publication No. 2001-933 is a spot shower type ultrasonic cleaning apparatus with which the cleaning liquid is concentratedly discharged to a narrow area, so that it is not suited for large objects to be cleaned. Thus, for large substrates and the like, for example, used is a line shower type ultrasonic cleaning apparatus in which a slit is provided to discharge the cleaning liquid in a line form.

When air bubbles enter into the supply line of the cleaning liquid in the spot shower type and line shower type ultrasonic cleaning apparatuses, the air bubbles surround the surface of the transducers. Thus, a range of contact between the transducers and the cleaning liquid becomes smaller. This may cause heating without liquid, which may result in having breakdown. In order to prevent such heating without liquid, it is necessary to control a water supply path for not allowing the air bubbles to enter. Further, it is necessary to supply a large amount of cleaning liquid continuously.

Further, the transducers are placed on the upper side of the cleaning liquid in the spot shower type and line shower type ultrasonic cleaning apparatuses, so that the vibration surfaces of the transducers need to be in contact with the cleaning liquid at all times in order for the ultrasonic wave to effectively work on the cleaning liquid. Therefore, it is necessary to continuously supply a vast amount of cleaning liquid such that the vibration surfaces are in contact with the liquid at all times.

In the meantime, in the horn type ultrasonic cleaning apparatuses disclosed in Japanese Patent Laid Open Publication No. 2005-85978 and Japanese Patent Laid Open Publication H03-258381, a liquid supply mechanism for supplying the cleaning liquid between the casing with the built-in ultrasonic transducer and the object to be cleaned is provided to supply the cleaning liquid for forming a liquid film between the casing with the built-in ultrasonic transducer and the object to be cleaned to perform cleaning.

Korean Patent Registered Publication No. 10-1336996 discloses ultrasonic cleaning by forming a liquid film, which employs a method with which the cleaning liquid is supplied from left and right sides of the cleaning apparatus for forming the liquid film at the center where the ultrasonic transducer part is located to clean the object to be cleaned. However, with this method, the liquid film cannot be formed at the center when the cleaning liquid is supplied uniformly from the left and right sides. Therefore, it is difficult with this method to adjust the supply amount of the cleaning liquid, and cleaning with line shower as in the present disclosure cannot be performed.

However, with the horn type ultrasonic cleaning apparatus, there may be cases where cleaning treatment cannot be performed and the cleaning effect cannot be acquired when the liquid film is not formed on the vibration surface of the ultrasonic waves. Further, when bubbles enter between the casing with the built-in transducers and the object to be cleaned, a similar cleaning effect as in the case of the shower type ultrasonic cleaning apparatus cannot be acquired.

Recently, the size of the objects to be cleaned has become larger, so that a line shower type ultrasonic cleaning apparatus with a still wider cleaning width is required and it is demanded to have uniform ultrasonic wave and flow amount in the lateral width direction of the objects to be cleaned. Furthermore, the use amount of the cleaning liquid becomes greater as the lateral width of the objects to be cleaned becomes wider. The conventional line shower type ultrasonic cleaning apparatus consumes a great amount of cleaning liquid and the running cost thereof is high. Thus, it is desired to suppress the consumption of the cleaning liquid and reduce the running cost.

In accordance with the increase in the size of the objects to be cleaned, desired is the ultrasonic cleaning apparatus of wide cleaning width, which uses a small amount of cleaning liquid while maintaining uniformity in cleaning in the lateral width direction of the objects to be cleaned.

Further, conventionally, it is necessary to prepare apparatuses depending on the methods since cleaning methods are different for the line shower type ultrasonic cleaning apparatus and the horn type ultrasonic cleaning apparatus.

It is therefore an object of the present invention to provide an ultrasonic cleaning apparatus and an ultrasonic cleaning system, which are capable of cleaning large-sized objects to be cleaned, e.g., semiconductor substrates such as glass substrates, flexible films, and the like, includes functions of the line shower type and horn type ultrasonic cleaning apparatuses, and are capable of saving the liquid by greatly reducing the cleaning liquid to be used.

An ultrasonic cleaning apparatus according to the present invention includes: a casing having a bottom surface to which ultrasonic vibration is applied by an ultrasonic transducer; a liquid film forming means configured to form a liquid film on the casing bottom surface through flowing a cleaning liquid along the casing bottom surface by supplying the cleaning liquid toward the bottom surface from one end side of the casing bottom surface; and a cleaning liquid discharge part that is provided at another end side of the casing bottom surface and configured to discharge the cleaning liquid flowing on the casing bottom surface toward an object to be cleaned.

Further, the bottom surface of the ultrasonic cleaning apparatus according to the present invention is tilted by a prescribed angle with respect to a horizontal plane so that the one end side is positioned at an upper side than the other end side.

Furthermore, the bottom surface of the ultrasonic cleaning apparatus according to the present invention is tilted within a range of 1° to 45° with respect to the horizontal plane.

Further, the liquid film forming means of the ultrasonic cleaning apparatus according to the present invention includes a cleaning liquid supply part configured to supply the cleaning liquid, and a cleaning liquid storage tank configured to store the cleaning liquid inside thereof, and the cleaning liquid storage tank includes an overflow rectifier configured to rectify the cleaning liquid by overflowing the cleaning liquid.

Furthermore, in the ultrasonic cleaning apparatus according to the present invention, notches are provided at a prescribed interval in an upper end of the overflow rectifier in a longitudinal direction.

Further, the liquid film forming means of the ultrasonic cleaning apparatus according to the present invention includes a flow-speed acceleration part configured to accelerate flow speed of the cleaning liquid, and the flow-speed acceleration part includes a supply flow path formed with the overflow rectifier and an outer lateral face of the casing and includes a cleaning liquid introduction path formed with the bottom surface of the casing and a cleaning liquid introduction member. The flow-speed acceleration part forms a liquid film on the casing bottom surface by flowing the cleaning liquid along the casing bottom surface from the cleaning liquid introduction path.

Further, in the ultrasonic cleaning apparatus according to the present invention, an ejection port is provided between the casing bottom surface and the cleaning liquid introduction member, and the flow-speed acceleration part is configured to accelerate the flow speed of the cleaning liquid ejected from the ejection port.

Further, the cleaning liquid supply part of the ultrasonic cleaning apparatus according to the present invention is attached to one lateral face of the casing, and the cleaning liquid discharge part is provided in a line form along an end part where another lateral face of the casing opposing to the one lateral face of the casing intersects with the other end side of the casing bottom surface.

Further, the ultrasonic cleaning apparatus according to the present invention includes a conveyor device configured to convey the object to be cleaned, in which the cleaning liquid discharge part is disposed on a conveying path of the conveyor device.

Furthermore, the ultrasonic cleaning apparatus according to the present invention includes a vibration cut-off body provided to a lateral face of the casing to cut off ultrasonic vibration.

Further, the ultrasonic cleaning apparatus according to the present invention includes a cleaning liquid adjustment plate that is provided between the casing bottom surface and the object to be cleaned to adjust a discharge amount of the cleaning liquid for the object to be cleaned.

An ultrasonic cleaning system according to the present invention includes an ultrasonic cleaning apparatus and a control device configured to control the ultrasonic cleaning apparatus, in which: the ultrasonic cleaning apparatus includes a casing having a bottom surface to which ultrasonic vibration is applied by an ultrasonic generation device via an ultrasonic transducer, a liquid film forming means including a cleaning liquid supply part configured to supply a cleaning liquid, the liquid film forming means forming a liquid film on the casing bottom surface through flowing the cleaning liquid along the casing bottom surface by supplying the cleaning liquid toward the bottom surface from one end side of the casing bottom surface, and a cleaning liquid discharge part that is provided at another end side of the casing bottom surface and discharges the cleaning liquid flowing on the casing bottom surface toward an object to be cleaned; and the control device outputs a cleaning liquid supply signal to a cleaning liquid supply open/close means configured to supply the cleaning liquid to the cleaning liquid supply part when starting cleaning to supply the cleaning liquid to the cleaning liquid supply part, outputs a generation start signal to the ultrasonic generation device after a prescribed time has passed to drive the ultrasonic generation device, outputs a generation stop signal to the ultrasonic generation device when ending the cleaning to stop drive of the ultrasonic generation device, and outputs a cleaning liquid supply stop signal to the cleaning liquid supply open/close means after a prescribed time has passed to stop supply of the cleaning liquid to the cleaning liquid supply part for controlling supply of the cleaning liquid for the casing bottom surface while driving the ultrasonic generation device.

Further, the ultrasonic cleaning system according to the present invention includes a conveyor means configured to convey the object to be cleaned, and a detection sensor configured to detect existence of the object to be cleaned on the conveyor means, in which the control device checks existence of the object to be cleaned on the conveyor means by the detection sensor, outputs the cleaning liquid supply signal to the cleaning liquid supply open/close means configured to supply the cleaning liquid to the cleaning liquid supply part when starting cleaning to supply the cleaning liquid to the cleaning liquid supply part, outputs a generation start signal to the ultrasonic generation device after a prescribed time has passed to drive the ultrasonic generation device, checks by the detection sensor when ending the cleaning that the object to be cleaned that has undergone cleaning treatment on the conveyor means has passed through, outputs a generation stop signal to the ultrasonic generation device to stop drive of the ultrasonic generation device, and outputs a cleaning liquid supply stop signal to the cleaning liquid supply open/close means after a prescribed time has passed to stop supply of the cleaning liquid to the cleaning liquid supply part.

According to the present invention, the liquid film forming means includes the flow-speed acceleration part that ejects the cleaning liquid from the cleaning liquid supply part to the casing bottom surface by accelerating the flow speed, and the cleaning liquid ejected from the flow-speed acceleration part is spread by the vibration of the ultrasonic transducer and flown on the tilted surface of the casing bottom surface to form the liquid film on the casing bottom surface. One surface of the liquid film of the cleaning liquid is in contact with the casing bottom surface while the other surface of the liquid film of the cleaning liquid is in contact with the air or the surface of the object to be cleaned, and the cleaning liquid flown on the casing bottom surface is discharged to the object to be cleaned located underneath. Thereby, the liquid film of the cleaning liquid is formed continuously on the casing bottom surface even when there is no object to be cleaned, thereby making a state where the casing bottom surface is in contact with the cleaning liquid at all times. Therefore, heating without liquid as a cause for breakdown can be prevented.

According to the present invention, the liquid film forming means includes the flow-speed acceleration part that ejects the cleaning liquid from the cleaning liquid supply part to the casing bottom surface by accelerating the flow speed, and the cleaning liquid ejected from the flow-speed acceleration part is spread by the vibration of the ultrasonic transducer, flown on the tilted surface of the casing bottom surface to form the liquid film on the casing bottom surface, and discharged concentratedly on a cleaning surface of the object to be cleaned located underneath the cleaning liquid flown on the casing bottom surface. Therefore, it is possible to perform cleaning with a less amount than the normal use amount of the cleaning liquid.

Further, the liquid film is formed on the casing bottom surface through having the cleaning liquid flown on the casing bottom surface, so that the heat generated by the ultrasonic transducer is efficiently absorbed. Therefore, it is possible to cool down the ultrasonic transducer and to provide stable vibration.

Further, according to the present invention, the supplied cleaning liquid is stored in the cleaning liquid storage tank, and the cleaning liquid overflown and rectified by the overflow rectifier is used. Thus, the supplied cleaning liquid is not directly discharged to the ultrasonic transducer and the object to be cleaned like the conventional case, so that the cleaning liquid can be flown uniformly. In addition, mixture and generation of bubbles can be reduced by using the overflown cleaning liquid, so that stable cleaning can be performed.

A single ultrasonic cleaning apparatus according to the invention has functions of spot shower type and horn type, so that the ultrasonic cleaning apparatus can be selectively used depending on the cleaning mode. That is, through placing the object to be cleaned close to the cleaning liquid discharge part, a liquid film is formed between the object to be cleaned and the casing bottom surface with the cleaning liquid discharged from the cleaning liquid discharge part. Therefore, a similar structure as that of the horn type can be achieved, and a high cleaning effect can be acquired.

Further, according to the present invention, the casing bottom surface is provided to oppose to the object to be cleaned in a tilted manner, so that it is possible to lighten cleaning unevenness generated by ultrasonic wavelengths depending on the distance from the casing bottom surface to the object to be cleaned. Further, through giving an angle to the casing bottom surface with respect to the object to be cleaned, concentration of the ultrasonic energy to a specific point of the ultrasonic transducer by reflection can be prevented so that breakdown of the ultrasonic transducer can be reduced. Even when the bottom surface of the casing is a horizontal surface, it is also possible to acquire the same effect as the case of providing the tilted surface to the casing bottom surface through placing the casing in a tilted manner.

Further, according to the present invention, the vibration cut-off body for cutting off ultrasonic vibration is provided to the casing. Therefore, it is possible to give the ultrasonic energy to the cleaning liquid and the object to be cleaned efficiently through suppressing vibration at the area of the casing upper part and the like not contributing to cleaning.

In addition, according to the present invention, the cleaning liquid activated by the ultrasonic wave is discharged in a line form from the end part of the casing bottom surface.

Thus, it is unnecessary to discharge the cleaning liquid by proving a slit or the like as in the case of the conventional line shower, so that the structure of the ultrasonic cleaning apparatus can be simplified.

Further, according to the present invention, the cleaning width keeping cleaning uniformity can be acquired in the lateral width direction to which the cleaning liquid is ejected. Thus, through discharging the cleaning liquid in a line form from the end part of the casing bottom surface, it is possible to deal with increase in the size of the objects to be cleaned.

In addition, according to the present invention, the cleaning width keeping cleaning uniformity can be acquired in the lateral width direction to which the cleaning liquid is ejected. Thus, through discharging the cleaning liquid from the casing bottom surface to the surface of the object to be cleaned in contact via the cleaning liquid, it is possible to deal with increase in the size of the objects to be cleaned.

Furthermore, the casing bottom surface is provided to oppose to the object to be cleaned in a tilted manner, so that the ultrasonic cleaning apparatus is effective not only for the object to be cleaned forming a plane such as a glass substrate but also for a member exhibiting flexibility such as a film.

BRIEF DESCRIPTION OF THE DRAWINGS

FIGS. 7A and 7B are flowcharts of the ultrasonic cleaning system when controlled by the cleaning management computer, in which FIG. 7A is a flowchart when starting cleaning treatment, and FIG. 7B is a flowchart when ending the cleaning treatment;

FIG. 8 is a sectional view showing a first embodiment of the ultrasonic cleaning apparatus according to the present invention;

FIG. 10 is a sectional view showing a third embodiment of the ultrasonic cleaning apparatus according to the present invention.

DETAILED DESCRIPTION OF THE PREFERRED EMBODIMENTS

Modes for embodying an ultrasonic cleaning apparatus and an ultrasonic cleaning system according to the present invention will be described by referring to the accompanying drawings of FIG. 1 to FIG. 10. The present invention includes a casing having a bottom surface provided to oppose to an object to be cleaned in a tilted manner and a cleaning liquid tank for temporarily storing a cleaning liquid, in which the cleaning liquid gone through the overflow rectifier that uniformly flows the cleaning liquid is ejected to the tilted casing bottom surface at an increased flow speed and the cleaning liquid flown on the bottom surface of the casing is discharged to the object to be cleaned to perform cleaning. This enables shower type and line type cleaning, thereby making it possible to save the cleaning liquid by greatly reducing the cleaning liquid to be used.

Figure 1:
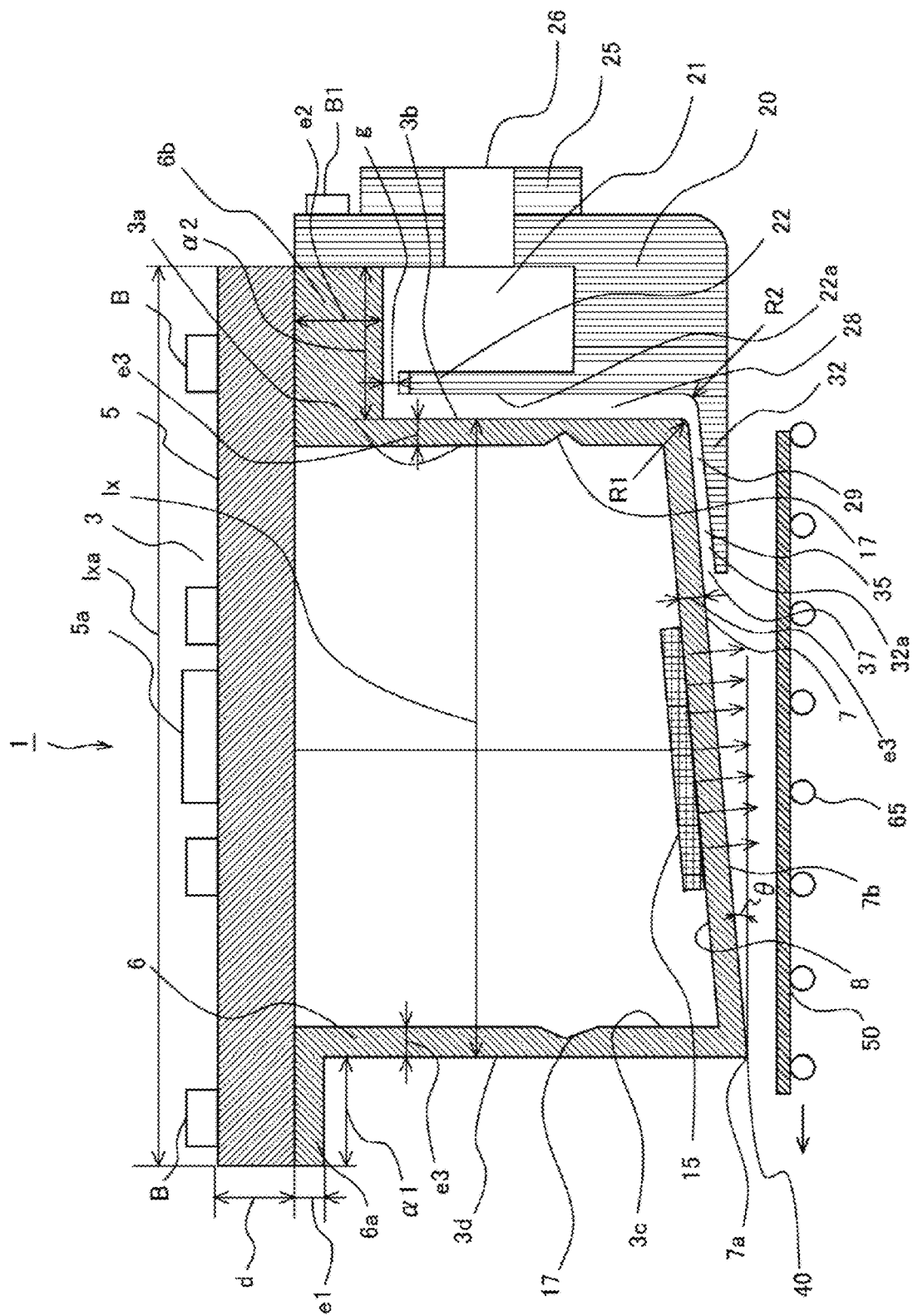
FIG. 1 is a sectional view of an ultrasonic cleaning apparatus according to the present invention viewed from a lateral face.
Figure 2:
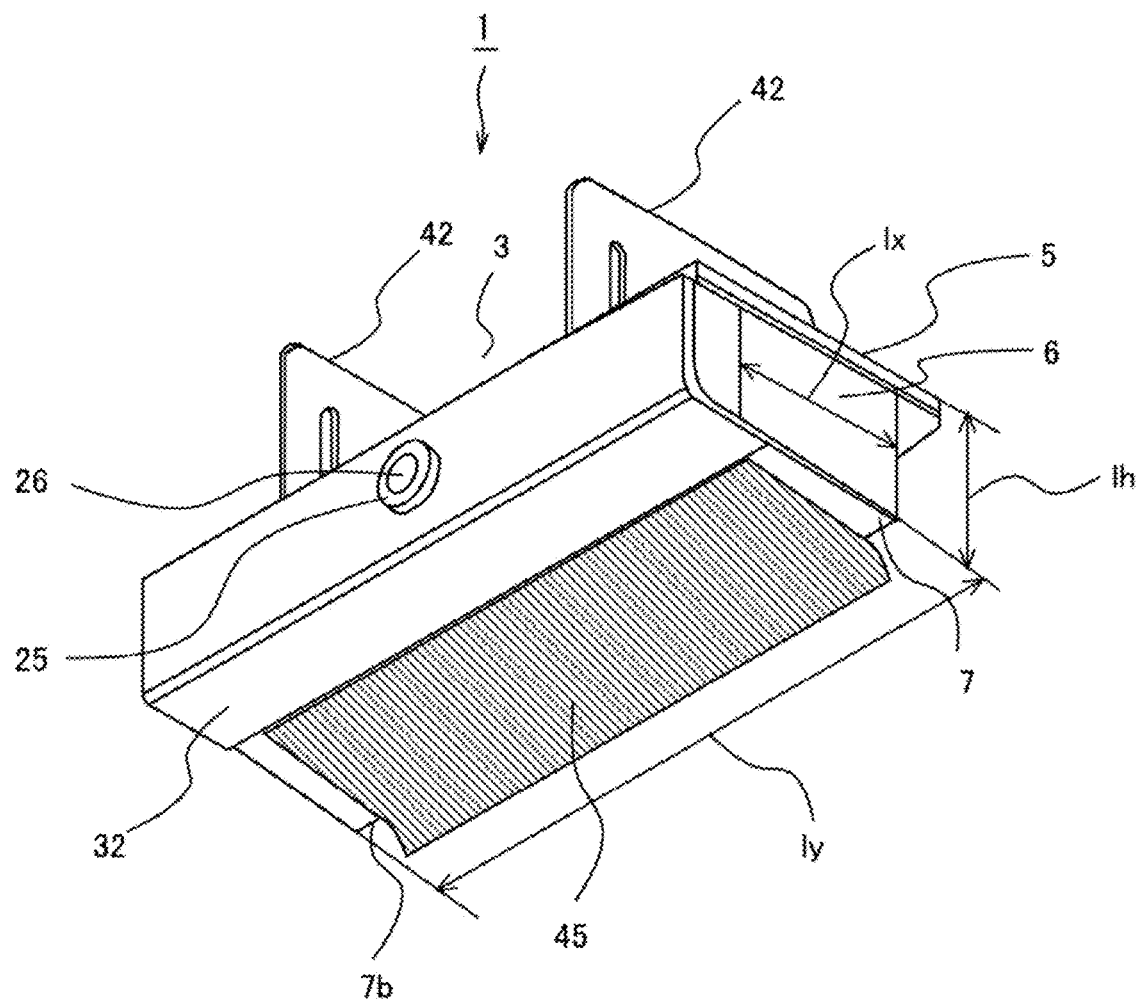
FIG. 2 is a perspective view showing an external appearance of the ultrasonic cleaning apparatus according to the present invention.

FIG. 1 is a sectional view of an ultrasonic cleaning apparatus 1 according to the present invention viewed from a lateral face, and FIG. 2 is a perspective view showing an external appearance of the ultrasonic cleaning apparatus according to the present invention.

The ultrasonic cleaning apparatus 1 according to the present invention includes a casing 3, a cleaning liquid supply device 20, and a flow-speed accelerator 35. Further, the cleaning liquid supply device 20 and the flow-speed accelerator 35 form a liquid film forming means.

As shown in FIG. 1 and FIG. 2, the casing 2 has: a rectangular upper plate 5 forming a lid part in lateral width lxa, lengthy in depth side of a vertical direction with respect to the paper face (longitudinal width ly), and thickness d; flange-like projected parts 6a and 6b which are in contact with the upper plate 5 and fixed with a plurality of bolts B at a prescribed interval; outer lateral faces 3b and 3d formed in thickness e by being extended in an integrated manner from the end parts of those projected parts 6a and 6b in a downward direction; and a bottom surface 7 formed in the thickness e by being connected integrally at lower end parts of those outer lateral faces 3b and 3d.

As shown in FIG. 1 and FIG. 2, the casing 3 is formed with the projected part 6a having the lateral width lx between the outer lateral faces 3b and 3d, the thickness e1, and lateral width $\alpha 1$ and the projected part 6b having thickness e2 thicker than the thickness e1 and lateral width $\alpha 2$ to satisfy "lateral width lx+lateral width $\alpha 1$+lateral width $\alpha 2$=lateral width lxa", i.e., to be the same as the lateral width of the upper plate 5. Further, the casing 3 is configured with a substantially boxed shape main body 6 whose longitudinal width lengthy in the vertical direction with respect to the paper face is ly and the height direction is lh. Note that a mounting bracket 42 is provided on the upper part of the upper plate 5 as shown in FIG. 2.

Note that the dimensions of each part shown in FIG. 1 are as follows, for example. The lateral axis lxa of the upper plate 5 is 112 mm, the thickness d is 5 mm, the lateral width $\alpha 1$ of the projected part 6a is 20 mm, the thickness e1 is 3 mm, the lateral width $\alpha 2$ of the projected part 6b is 21 mm, the thickness e2 is 10 mm, and the thickness e3 of the outer lateral faces 3b, 3d and the thickness e3 of the bottom surface 7 are 3 mm. Further, the dimensions shown in FIG. 2 in a case where the length of the lateral width of an object to be cleaned 50 is 1500 mm and the length of the longitudinal width is 1800 mm, the lateral width lx is 71 mm, the longitudinal width ly is 1660 mm, and the height lh is 55 mm. In the embodiments according to the present invention, the dimensions are not limited to those values and may be changed as appropriate.

As shown in FIG. 1, the bottom surface 7 of the casing 3 is formed by being tilted toward the opposite direction from the conveying direction (shown with an arrow) of the object to be cleaned 50. That is, the bottom surface 7 of the casing 3 is provided to have a tilt angle $\theta$ with respect to a horizontal plane. As shown in FIG. 1, the tilt angle θ of the bottom surface 7 can take a range of 1° and 45°. When the ultrasonic frequency is 1 MHz, the tilt angle θ of the bottom surface 7 in the embodiment of the present invention is set as 5°. However, the size, thickness of the casing 3, the tilt angle θ of the bottom surface 7, and the like may be changed as appropriate in the embodiment of the present invention. The tilt angle of the bottom surface 7 is set by placing the casing 3 to be tilted at a prescribed angle such that the liquid film forming means provided on one end side of the bottom surface 7 is located at a higher position than a cleaning liquid discharge part 40 (illustrated in FIG. 1) provided on the other end side, or by placing the casing with the bottom surface of the casing being tilted at a prescribed angle with respect to the horizontal plane.

Note that setting of the tilt angle can be adjusted as appropriate through fixing to the apparatus with the mounting bracket 42 by a worker.

As shown in FIG. 1, under the bottom surface 7 of the casing 3, the object to be cleaned 50 placed on a conveyor device 65 capable of moving in an arrow direction is disposed. The object to be cleaned 50 according to the embodiment is liquid crystal glass or the like with 1500 mm in the length of the lateral width and 1800 mm in the length of the longitudinal width. Therefore, the casing 3 is in a size fully capable of cleaning the liquid crystal glass of such size.

As shown in FIG. 1, the casing 3 according to the present invention has the bottom surface 7 that is located on an upper side by being isolated from the object to be cleaned 50 and forms a tilted surface provided to oppose to the object to be cleaned 50, and an ultrasonic transducer 15 of the ultrasonic generation device is provided on an inner lower surface 8 of the casing. Note that the casing 3 according to the present invention has the bottom surface 7 provided to have a prescribed angle with respect to the horizontal plane, and does not impregnate the cleaning liquid inside the casing 3. The casing 3 includes the ultrasonic generation device built in the inner lower surface 8 of the casing, and the cleaning liquid discharge part 40 discharging the cleaning liquid provided at an end part 7a of a casing bottom surface 7b forming a tilted surface.

As described, the casing 3 according to the present invention is not a type with which the cleaning liquid is stored inside the casing or the cleaning liquid is flown to the ultrasonic transducer provided inside the casing like the conventional casing but is a type with which the cleaning liquid ejected from the flow-speed accelerator is spread by the vibration of the bottom surface and flown along the tilted surface of the casing bottom surface 7b to form the liquid film on the casing bottom surface 7b.

While the casing 3 is formed with a metal member such as stainless or the like, the member is not limited to the metal member such as stainless or the like but another member such as quartz may be used as well.

Figure 6:
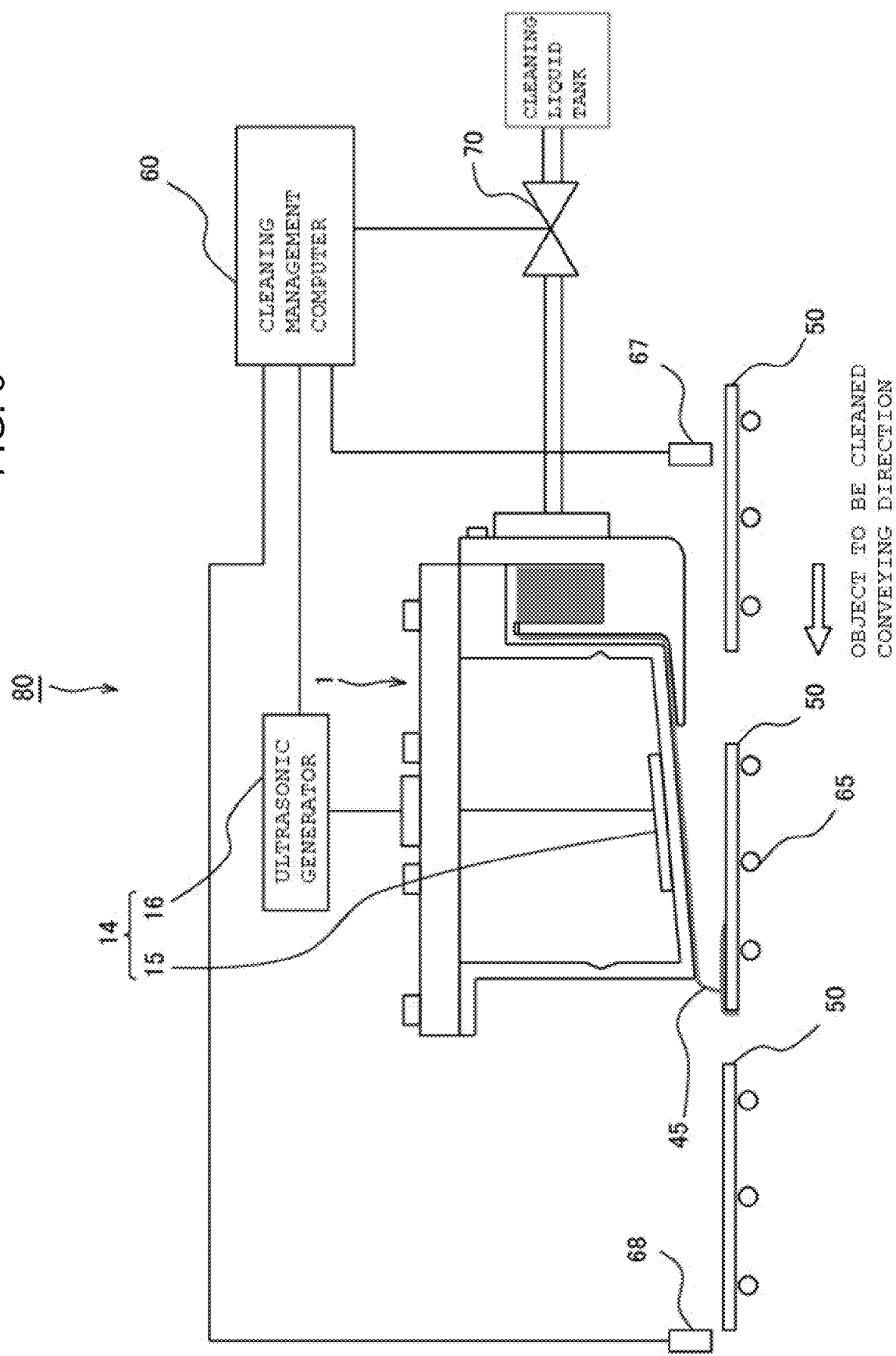
FIG. 6 is a block diagram showing a structure of an ultrasonic cleaning system executed by a cleaning management computer.

Further, as shown in FIG. 1, the casing 3 has the ultrasonic transducer 15 of the ultrasonic generation device built-in on the inner lower surface 8 of the casing. The ultrasonic generation device 14 includes the ultrasonic transducer 15 and an ultrasonic generator 16 as shown in FIG. 6. However, as shown in FIG. 1, the ultrasonic transducer 15 of the ultrasonic generation device 14 (illustrated in FIG. 6) is illustrated on the inner lower surface 8 of the casing, and the ultrasonic transducer 15 is in a size capable of propagating sufficient ultrasonic vibration to the object to be cleaned 50, i.e., liquid crystal glass, for example, of 1500 mm in the length of the lateral width and 1800 mm in the length of the longitudinal width. The size of the ultrasonic transducer 15 can be set as appropriate depending on the size of the object to be cleaned 50.

Further, on the upper plate 5 of the casing 3, a cable introduction port 5a is provided. Electric power, signals, and the like are supplied to the ultrasonic generation device via the cable introduction port 5a. Regarding the ultrasonic generation device 14 according to the present invention, as shown in FIG. 6, the ultrasonic transducer 15 is provided inside the casing 3 while the ultrasonic generator 16 is separately provided from the ultrasonic cleaning apparatus 1. However, the ultrasonic generator 16 may be provided at an upper space inside the casing 3. Thereby, the ultrasonic cleaning apparatus 1 is formed in an integrated structure, so that it is possible to perform cleaning of the object to be cleaned 50 as a single piece that is not conveyed by the conveyance device such as the conveyor device 65.

Further, as shown in FIG. 1, the ultrasonic transducer 15 attached on the inner lower surface 8 of the casing is attached with an adhesive or the like on the inner lower surface 8 of the casing, and the ultrasonic transducer 15 is tilted with respect to the horizontal plane like the bottom surface 7. The ultrasonic transducer 15 is made with lead zirconate titanate (PZT) as an electrostrictive vibrator, has a square-plate shape, and mainly uses thickness vibration. Through using the plate-shape ultrasonic transducer 15 in accordance with the bottom surface 7 having substantially rectangular plate shape, the whole bottom surface 7 can be vibrated uniformly. Note that the ultrasonic transducer is not limited to the electrostrictive vibrator, and other types of transducers may be used as well.

As shown in FIG. 1, the bottom surface 7 of the casing 3 is tilted at the tilt angle θ, so that ultrasonic vibration generated from the ultrasonic transducer 15 of the ultrasonic generation device is propagated to be in a vertical direction shown with an arrow. Thereby, the inner lower surface 8 of the casing with the built-in ultrasonic transducer 15 superimposes an ultrasonic energy to a cleaning liquid 45 (illustrated in FIG. 2) flowing on the casing bottom surface 7b.

Even when the bottom surface 7 of the casing is a flat surface, the casing may be placed by being tilted so that the bottom surface 7 turns to a tilted surface.

In the casing 3 according to the present invention, the bottom surface 7 is tilted to have the tilt angle θ with respect to the horizontal plane. When the bottom surface 7 is placed horizontally without having the tilt angle θ, the ultrasonic transducer 15 is also provided to be horizontal. If so, the ultrasonic vibration emitted from the ultrasonic transducer 15 is emitted not in the arrow direction shown in FIG. 1 but in the downward direction, i.e., the direction orthogonal to the horizontal plane. Thus, the ultrasonic vibration wave discharged to the cleaning surface of the object to be cleaned 50 is reflected and returned to the ultrasonic transducer 15, and the attaching face of the ultrasonic transducer 15 and the like may be destroyed. In order to avoid such phenomena, the bottom surface 7 is tilted. For example, when placed horizontally with respect to the object to be cleaned 50 in a case of a conventional horn type, the ultrasonic energy by the reflection concentrates on the ultrasonic transducer 15. Thus, it is likely to be influenced by the reflection of the ultrasonic wave, and the risk of having breakdown is increased.

Further, in the ultrasonic cleaning apparatus 1 according to the present invention, the casing bottom surface 7b is positioned on an upper side by being isolated from the object to be cleaned 50 and provided by being tilted with respect to the object to be cleaned 50. Therefore, it is possible to lighten cleaning unevenness caused by the ultrasonic wavelength depending on the distance from the casing bottom surface 7b to the object to be cleaned 50. Further, through providing the tilt angle θ to the casing bottom surface 7b with respect to the object to be cleaned 50, concentration of the ultrasonic energy to a specific point of the ultrasonic transducer by the reflection can be prevented and the risk of having breakdown can be reduced.

Further, the ultrasonic cleaning apparatus 1 according to the present invention is assumed to clean large-size liquid crystal glass or the like as the object to be cleaned 50. The large-size clean target 50 may have a wavy cleaning surface (illustrated in FIG. 4) in some cases, and such object to be cleaned 50 can also be cleaned efficiently. This will be described in more detail in a section describing FIG. 4.

The casing 3 according to the present invention having the above-described structure is configured to propagate the ultrasonic vibration to the surface where the vibration area located in the casing bottom surface 7b is in contact with the ultrasonic transducer 15 attached to the inner lower surface 8 of the casing and the neighboring surfaces, so that the vibration of the ultrasonic transducer 15 can be effectively propagated via the bottom surface 7 of the casing 3.

In the casing 3 having the above-described structure is configured such that the cleaning liquid 45 flows over substantially the whole casing bottom surface 7b as shown in FIG. 2 by the cleaning liquid supply device 20 that supplies the cleaning liquid and the flow-speed accelerator 35 that ejects the cleaning liquid to the casing bottom surface 7b by accelerating the flow speed of the cleaning liquid from the cleaning liquid supply device 20. Therefore, the liquid film is formed between the casing bottom surface 7b and the object to be cleaned 50 (illustrated in FIG. 8 and the like) and the ultrasonic energy can be directly propagated to the object to be cleaned 50 via the liquid film.

Figure 3A:
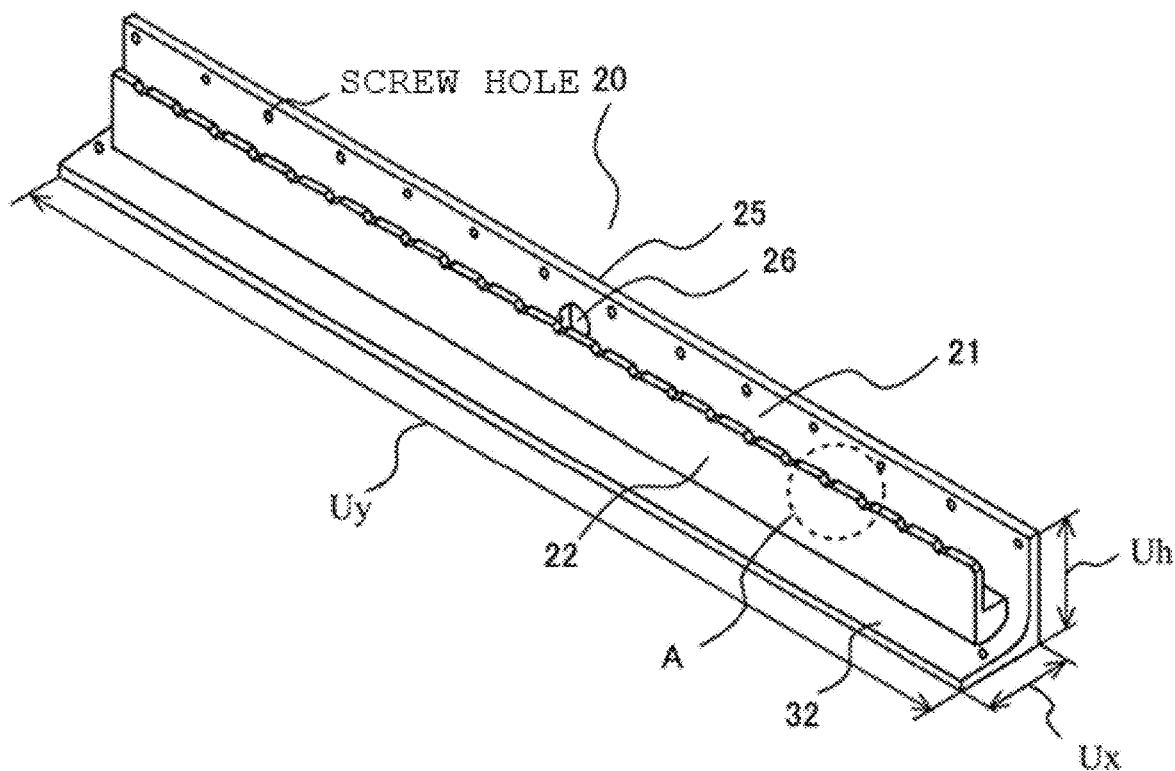
FIG. 3A is a perspective view showing a cleaning liquid supply device in the ultrasonic cleaning apparatus.
Figure 3B:
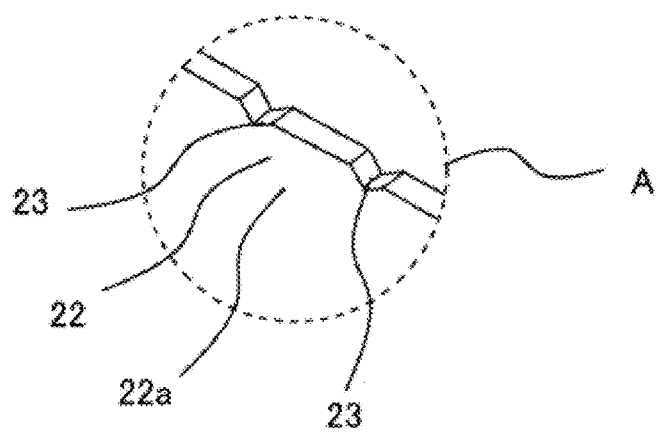
FIG. 3B shows an enlarged view of an area A in a broken-line circle shown in FIG. 3A, which is a part of a structure of an upper end of an overflow rectifier.

Next, the cleaning liquid supply device 20 as the liquid film forming means of the ultrasonic cleaning apparatus 1 according to the present invention will be described by referring to FIG. 1 to FIGS. 3A, 3B. As shown in FIG. 1, the cleaning liquid supply device 20 as the liquid film forming means is provided on the lateral face of the casing 3. The detail of the structure of the cleaning liquid supply device 20 is shown in FIGS. 3A and 3B. FIG. 3A is a perspective view showing the cleaning liquid supply device 20 in the ultrasonic cleaning apparatus 1, and FIG. 3B is an enlarged view of an area A in a broken-line circle shown in FIG. 3A, which is a part of the structure of an upper end of the overflow rectifier.

As shown in FIG. 1 and FIG. 3A, the cleaning liquid supply device 20 as the liquid film forming means includes a cleaning liquid supply part 25 and a cleaning liquid storage tank 21 to which the cleaning liquid is supplied from the cleaning liquid supply part 25. The cleaning liquid storage tank 21 also functions as a storage tank that temporarily stores the cleaning liquid supplied from a cleaning liquid supply port 26.

The cleaning liquid supply device 20 is attached and fixed to the edge surface of the projected part 6a of the casing 3 with a plurality of bolts B1 at a prescribed interval via screw holes provided to the cleaning liquid supply part 25. Further, as shown in FIG. 3A, an overflow rectifier 22 and a cleaning liquid introduction member 32 of the flow-speed accelerator 35 are integrally formed in the cleaning liquid supply device 20.

As shown in FIG. 2, the cleaning liquid supply device 20 is formed in a size corresponding to the size of the casing 3 formed with the substantially box-shaped main body 6. That is, as shown in FIG. 3A, the whole shape is formed with a laterally long structure. The lateral width, the longitudinal width, the height, and the like of the cleaning liquid supply device 20 can be set in accordance with the size of the casing 3. In the case where the length of the lateral width of the object to be cleaned 50 is 1500 mm and the length of the longitudinal width is 1800 mm, lateral width Ux is 40 mm, longitudinal width Uy is 1660 mm, and height Uh is 48 mm in the cleaning liquid supply device 20 according to the present invention. However, it is needless to say that the size is not limited to such values.

As shown in FIG. 1 to FIGS. 3A, 3B, the cleaning liquid supply part 25 has the cleaning liquid supply port 26 that supplies the cleaning liquid for cleaning the object to be cleaned 50 by connecting a pipe or the like to the cleaning liquid storage tank 21 from outside. The cleaning liquid 45 is supplied to the cleaning liquid supply port 26 provided to the cleaning liquid supply part 25. While the cleaning liquid supply port 26 is provided at one point as can be seen from FIG. 2 and FIG. 3A, it is also possible to provide the cleaning liquid supply port 26 at a plurality of points. That is, the cleaning liquid supply ports 26 may be provided at a prescribed interval in the direction of the longitudinal width ly shown in FIG. 2 or other structures may be employed as well. The cleaning liquid supply port 26 may be set as appropriate depending on the length of the cleaning liquid supply device 20 in the longitudinal direction, the flow amount of the cleaning liquid to be supplied, and the like.

The cleaning liquid 45 (illustrated in FIG. 2) supplied from the cleaning liquid supply port 26 is supplied to the cleaning liquid storage tank 21 provided in an area sectioned with the flange-shaped projected part 6b of the casing 3 and the cleaning liquid supply port 26 on the opposing side of the outer lateral face 3b of the casing 3.

The cleaning liquid storage tank 21 can be attached and fixed with the bolts B or the like by having the upper surface of the flange-shaped projected part 6b of the casing 3 and the lower surface of the upper plate 5 of the casing 3 come in contact with each other. At the same time, through utilizing the lower surface of the projected part 6b by thickening the thickness e2 of the projected part 6b than the thickness e1 of the other projected part 6a, the area of the cleaning liquid storage tank 21 can be settled. Accordingly, with the cleaning liquid storage tank 21 according to the present invention, the cleaning liquid supply device 20 itself can be reduced in size and also the ultrasonic cleaning apparatus 1 according to the present invention can be reduced in size to be in a compact size based on the idea of sharing the flange-shaped projected part 6b of the casing 3 and the outer surface side of the outer lateral face 3b.

As shown in FIG. 1 and FIG. 3A, inside the area where the cleaning liquid storage tank 21 is settled, the overflow rectifier 22 forming a wall of substantially L-shaped section in the direction of the longitudinal width Uy is provided. The overflow rectifier 22 supplies the cleaning liquid 45 (illustrated in FIG. 2) to the bottom surface 7b by overflowing the cleaning liquid 45 from the upper part of the wall as the overflow rectifier 22. Thus, as shown in FIG. 1, there is a space between the upper part of the wall as the overflow rectifier 22 and the lower surface of the projected part 6b. That is, a gap g is 1 mm. However, the thickness e of the projected part 6b may be changed to completely eliminate the gap g to be like a lid, or the gap g may be provided as shown in FIG. 1. This is for making the flow of the cleaning liquid flown from the overflow rectifier 22 uniform, so that it is possible to be set as appropriate.

As shown in FIG. 1, a supply flow path 28 for guiding the cleaning liquid 45 to the casing bottom surface 7b side is formed between the outer surface side of the outer lateral face 3b of the casing 3 and a lateral face 22a of the overflow rectifier (wall) of the cleaning liquid supply device 20.

As described above, the cleaning liquid supply device 20 attached to the casing 3 also functions as a temporary storage tank for temporarily storing the cleaning liquid 45 from the cleaning liquid supply port 26 in the cleaning liquid storage tank 21, and forming and rectifying a uniform flow of the cleaning liquid from the overflow rectifier 22 to guide to the supply flow path 28.

The cleaning liquid 45 supplied from the cleaning liquid supply port 26 is temporarily stored in the cleaning liquid storage tank 21. When the cleaning liquid storage tank 21 is filled with the cleaning liquid 45, the cleaning liquid 45 rectified to a uniform flow is guided to the supply flow path 28 from the upper part of the wall as the overflow rectifier 22.

As shown in FIG. 3B, V-grooves 23 as notches are provided on the upper part of the overflow rectifier 22 (wall) at a prescribed interval. Through providing the V-grooves 23 as the notches on the upper part of the overflow rectifier 22, the cleaning liquid supply device 20 according to the present invention can uniformly guide the overflown cleaning liquid 45 that goes through the V-grooves 23 as the notches and is rectified over the entire wall surface of the lateral face 22a of the overflow rectifier 22. While the inventors of the ultrasonic cleaning apparatus 1 according to the present invention experimentally have checked to be embodied that the shape of the V-grooves 23 allow the cleaning liquid 45 to be guided to the supply flow path 28 in a uniform flow through making the cleaning liquid 45 to be overflows go through the V-grooves 23 as the notches, other shapes are not excluded as long as those shapes are capable of deriving a uniform flow. That is, as a means for forming a uniform flow, the inventors of the ultrasonic cleaning apparatus 1 according to the present invention devise such spirit of the present invention to, first, provide the cleaning liquid storage tank 21, secondly, provide the overflow rectifier 22 to the cleaning liquid storage tank 21, and thirdly, provide the notches at a prescribed interval, and it is not to be restricted to the shape of "V" of the V-groove 23 as the notch as long as the shape can form a uniform flow with the overflow rectifier 22. In short, it is to be comprehended that the V-grooves 23 as the notches are taken as one mode for embodying the present invention, since it is found based on number of experiments that the V-grooves as the notches are optimal for forming a uniform flow at the point where the present invention is completed.

Next, described is the flow-speed accelerator 35 as the flow-speed acceleration part that ejects the cleaning liquid 45 to the casing bottom surface 7b by accelerating the flow speed of the cleaning liquid 45 from the cleaning liquid supply device 20.

As shown in FIG. 1 to FIG. 3A, the flow-speed accelerator 35 includes: the supply flow path 28 formed with the overflow rectifier 22 as the wall (including the lateral face 22a) of substantially L-shaped section in the direction of the longitudinal width Uy and the outer surface side of the outer lateral face 3b of the casing 3; the cleaning liquid introduction member 32 with a flange-shaped section on a lower part of the overflow rectifier 22 as the wall (including the lateral face 22a) of substantially L-shaped section in the direction of longitudinal width Uy; and a cleaning liquid introduction path 29 which is communicated with the supply flow path 28 and formed with the cleaning liquid introduction member 32 and the opposing casing bottom surface 7b.

The cleaning liquid supply device 20 as the liquid film forming means according to the present invention is fixed to the edge surface of the projected part 6b of the casing 3 with the plurality of bolts B1, and provided with the cleaning liquid storage tank 21 having the overflow rectifier 22 within the area sectioned between the lower part of the projected part 6b of the casing 3 and the outer surface side of the outer lateral face 3b of the casing 3. Note that the same member is used in common for the overflow rectifier 22 of the flow-speed accelerator 35 as the flow-speed accelerator and the overflow rectifier 22 of the cleaning liquid storage tank 21 of the cleaning liquid supply device 20 as the liquid film forming means, so that the downsizing can be achieved in that sense.

Next, as shown in FIG. 1, a connecting part between the supply flow path 28 and the cleaning liquid introduction path 29 communicating therewith, i.e., a connecting part between the outer lateral face 3b of the casing 3 and the casing bottom surface 7b, forms a curvature R1. Further, a connecting part between the lower part of the overflow rectifier 22 and the cleaning liquid introduction member 32 on the opposing face side of the curvature R1 forms a curvature R2. For example, the curvature R1 is 3 mm, and the curvature R2 is 2 mm. Thereby, the cleaning liquid 45 supplied from the supply flow path 28 can be guided to the cleaning liquid introduction path 29 without disturbing the uniform flow. Note that setting of the curvature R1 and the curvature R2 may be changed as appropriate.

As shown in FIG. 1, the cleaning liquid introduction member 32 is a waterway formed by being extended in substantially a flat plate form by opposing along the tilted surface of the bottom surface 7 of the casing 3 toward a leading end part 32a. The width of the cleaning liquid introduction path 29 formed as the waterway with the casing bottom surface 7b and the cleaning liquid introduction member 32 is set to be narrower than the width of the cleaning liquid storage tank 21. That is, there is a relation of "the cleaning liquid introduction path 29<the cleaning liquid storage tank 21".

This provides the structure where the flow speed of the cleaning liquid 45 can be accelerated. Further, the leading end part 32a of the cleaning liquid introduction member 32 has an ejection port 37 as an opening for making it possible to eject the cleaning liquid 45 from the cleaning liquid introduction path 29 as the waterway.

Then, the cleaning liquid 45 passed through the supply flow path 28 between the wall (including the lateral face 22a) of the overflow rectifier 22 and the outer lateral face 3b of the casing 3 is guided to the cleaning liquid introduction path 29. The cleaning liquid 45 guided to the cleaning liquid introduction path 29 is ejected from the ejection port 37 as the opening with the accelerated flow speed. The flow-speed accelerator 35 according to the present invention is configured to accelerate the flow speed by shortening the distance (also referred to as width) between the casing bottom surface 7b and the cleaning liquid introduction member 32.

As shown in FIG. 1 and FIG. 2, the cleaning liquid 45 ejected from the ejection port 37 by being accelerated in the flow speed by the flow-speed accelerator 35 as the flow-speed acceleration part flows to the tilted casing bottom surface 7b side of the casing 3, thereby forming a liquid film on the casing bottom surface 7b.

As shown in FIG. 1 and FIG. 2, the cleaning liquid 45 flown on the casing bottom surface 7b is discharged from the cleaning liquid discharge part 40. The cleaning liquid discharge part 40 is located at the end part 7a of the casing bottom surface 7b at which the outer lateral face 3d of the casing 3 intersects with the casing bottom surface 7b.

Further, as shown in FIG. 1, the ultrasonic cleaning apparatus 1 according to the present invention includes the ultrasonic transducer 15 of the ultrasonic generation device, and the cleaning liquid 45 is activated through applying the ultrasonic energy generated from the ultrasonic transducer 15 to the cleaning liquid 45. The cleaning liquid 45 to which the ultrasonic energy is applied is discharged in a line form along the end part 7a of the casing bottom surface 7b.

Further, as shown in FIG. 1, the ultrasonic cleaning apparatus 1 includes the conveyor device 65 for conveying the object to be cleaned 50. The conveyor device 65 is formed with a belt conveyor or the like, and conveys the object to be cleaned 50 in a direction shown with an arrow.

Further, as shown in FIG. 1, the ultrasonic cleaning apparatus 1 includes a vibration cut-off body 17 for cutting off the ultrasonic vibration provided on the lateral face of the casing 3. The vibration cut-off body 17 cuts off the ultrasonic vibration such that the ultrasonic vibration generated from the bottom surface 7 does not propagate to the upper part of the casing 3. For the vibration cut-off body 17, a notch is provided in the vicinity of the center inside the casing 3 toward the outer lateral face 3d. That is, the vibration cut-off body 17 is provided to each of the inner lateral faces 3a and 3c of the casing 3, for example.

Note that the vibration cut-off body 17 is not limited to be formed by providing a notch, and other types may be employed as well. Further, the vibration cut-off body 17 may be provided to both of the opposing outer lateral faces 3b and 3d of the casing 3. Furthermore, the notch of the vibration cut-off body 17 simply needs to be able to cut off the vibration so that the vibration does not propagate to the upper part of the casing 3, and may be formed in all the inner lateral faces of the casing 3. As described, the length of the notch in the inner lateral face of the casing 3 can be set as appropriate.

Since the excessive vibration generated in the casing 3 can be cut off by the vibration cut-off body 17, loss of the vibration energy can be reduced.

As described, the ultrasonic cleaning apparatus 1 can flow the cleaning liquid 45 to the casing bottom surface 7b by the cleaning liquid supply device 20 as the liquid film forming means, so that the liquid film of the cleaning liquid 45 is continuously formed on the casing bottom surface 7b even in a state where the object to be cleaned 5 is not placed. Thus, the casing bottom surface 7b is in contact with the cleaning liquid 45 at all times, so that accidental heating without liquid can be prevented.

Figure 4:
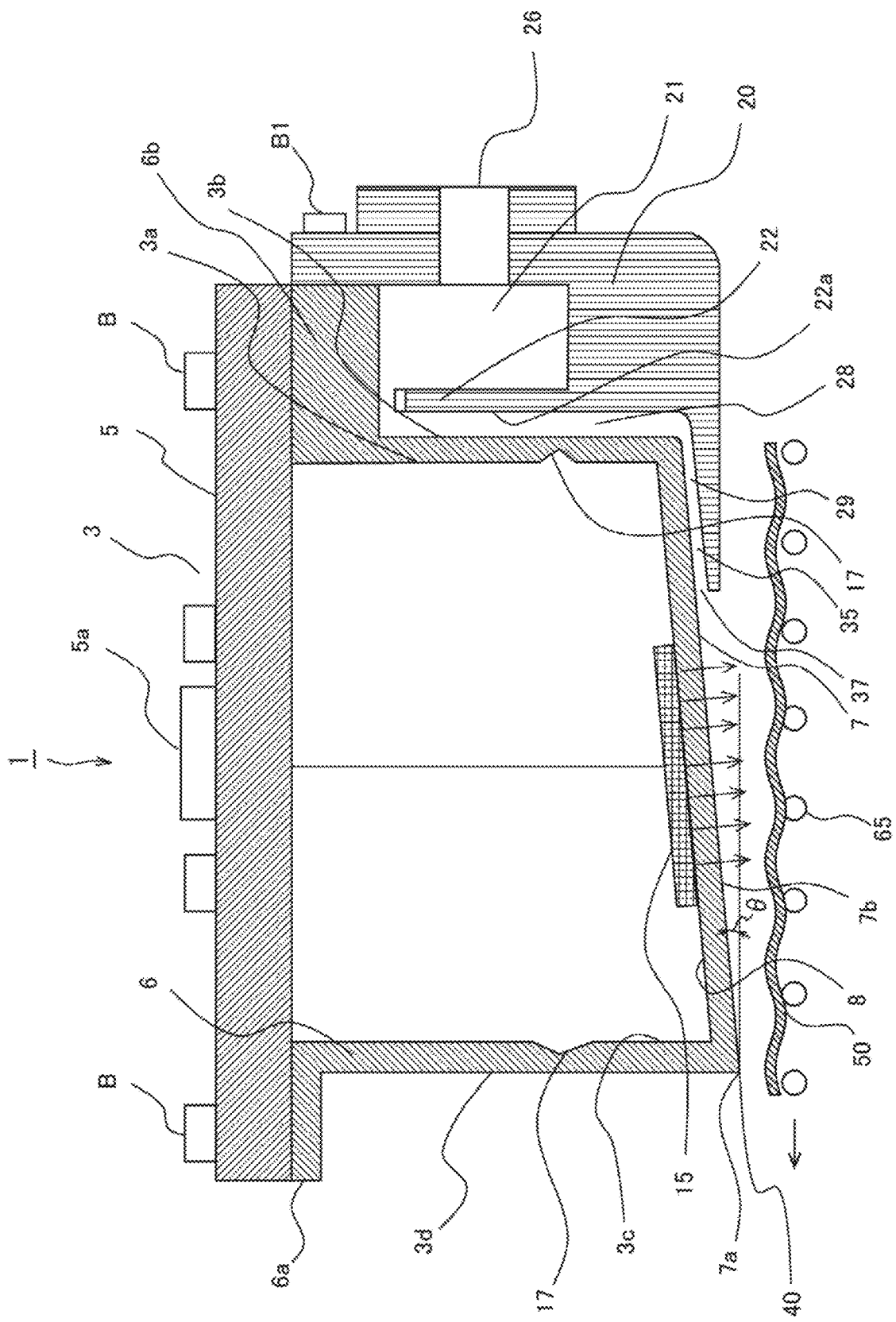
FIG. 4 is a sectional view of the ultrasonic cleaning apparatus viewed from the lateral face, which cleans a member exhibiting flexibility as an object to be cleaned.

While the ultrasonic cleaning apparatus according to the present invention can clean the liquid crystal glass as the object to be cleaned, an embodiment of the ultrasonic cleaning apparatus capable of cleaning a member such as a flexible film as an object to be cleaned will be described next by referring to FIG. 4. FIG. 4 is a sectional view of the ultrasonic cleaning apparatus viewed from the lateral face, which cleans the member exhibiting flexibility as an object to be cleaned. Note that the ultrasonic cleaning apparatus shown in FIG. 4 is in the same structure as that of the ultrasonic cleaning apparatus shown in FIG. 1 except for the object to be cleaned 50, so that same reference numerals are used and detailed explanations are omitted.

As shown in FIG. 4, the object to be cleaned 50 formed with a member exhibiting flexibility such as a film has a wavy surface so that the height on a plane is not constant. Therefore, the bottom surface 7 of the casing 3 is tilted to have a tilt angle θ to form a liquid film between the object to be cleaned 50 and the casing bottom surface 7b. Through tilting the bottom surface 7 of the casing 3, the position of the sound pressure intensity of the ultrasonic wave in the vertical direction changes and it is possible to give some latitude in the sound pressure intensity distribution of the ultrasonic wave in the vertical direction on the casing bottom surface 7b. Therefore, even when the distance between the casing bottom surface 7b and the object to be cleaned 50 is changed, the object to be cleaned can be placed within the range of the sound pressure intensity distribution of the ultrasonic wave through conveying the object to be cleaned 50 by the conveyor device 65. Therefore, the whole surface of the object to be cleaned 50 can be cleaned uniformly at the optimal position of the sound pressure of the ultrasonic wave.

As described, in the ultrasonic cleaning apparatus 1, the casing bottom surface 7b is provided to oppose to the object to be cleaned 50 in a tilted manner, so that it is effective not only for the object to be cleaned 50 forming a plane such as a glass substrate but also for a member exhibiting flexibility such as a film.

Figure 5:
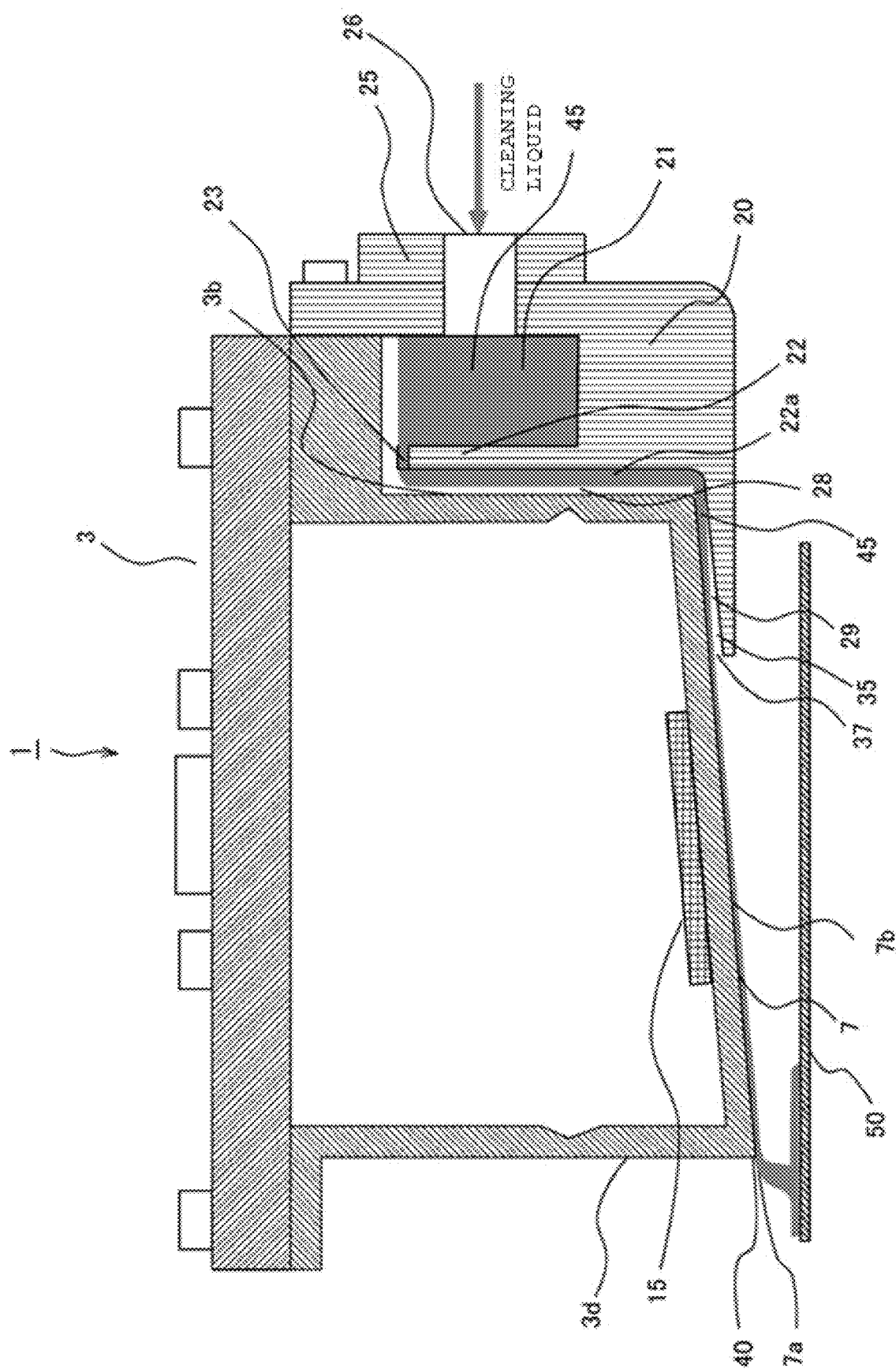
FIG. 5 is an illustration showing a flowing body of a cleaning liquid of the ultrasonic cleaning apparatus according to the present invention during cleaning.

Next, a flowing body of the cleaning liquid during cleaning done by the ultrasonic cleaning apparatus according to the present invention will be described by referring to FIG. 5. FIG. 5 is an illustration showing a flowing body of the cleaning liquid of the ultrasonic cleaning apparatus of the present invention during cleaning. The flowing body of the cleaning liquid will be described by using the cleaning liquid 45 shown with hatching in FIG. 5.

As shown in FIG. 5, the cleaning liquid 45 supplied from the cleaning liquid supply port 26 of the cleaning liquid supply part 25 in the cleaning liquid supply device 20 flows into the cleaning liquid storage tank 21 and stored temporally in the cleaning liquid storage tank 21. On the edge surface of the upper part of the overflow rectifier 22 of the cleaning liquid storage tank 21, the V-grooves 23 as the notches are provided at a prescribed interval. The cleaning liquid 45 that reaches the upper part of the overflow rectifier 22 flows in a downward direction in the supply flow path 28 provided between the outer lateral face 3b of the casing 3 and the lateral face 22a of the overflow rectifier 22 from the V-grooves 23 in the upper part of the overflow rectifier 22.

As described, the V-grooves 23 are provided at a prescribed interval on the edge surface of the upper part of the overflow rectifier 22 as shown in FIG. 3B, so that the cleaning liquid 45 rectified on the lateral face 22a of the overflow rectifier 22 can be flown uniformly. In short, the cleaning liquid 45 to be supplied does not directly flow in the supply flow path 28 so that the cleaning liquid 45 can be flown into the supply flow path 28 in a stable state without being influenced by turbulent and the like of the cleaning liquid 45 to be supplied.

The cleaning liquid 45 from the supply flow path 28 is guided into the cleaning liquid introduction path 29 provided in the lower part of the overflow rectifier 22.

The cleaning liquid 45 guided from the cleaning liquid introduction path 29 is sprayed to the casing bottom surface 7b side from the ejection port 37 by being accelerated in the flow speed thereof by the flow-speed accelerator 35 as the flow-speed acceleration part.

The cleaning liquid 45 sprayed from the ejection port 37 of the flow-speed accelerator 35 as the flow-speed acceleration part flows to the tilted casing bottom surface 7b side. When the ultrasonic transducer 15 of the ultrasonic generation device is driven, the ultrasonic energy is applied to the cleaning liquid 45 by vibration of the ultrasonic transducer 15, and the casing bottom surface 7b turns to a water-flowing surface where the liquid film is formed. Regarding the liquid film formed on the casing bottom surface 7b, one surface of the liquid film 45 is in contact with the casing bottom surface 7b while the other surface of the liquid film of the cleaning liquid 45 is in contact with the air or the surface of the object to be cleaned 50.

In the ultrasonic cleaning apparatus 1 according to the present invention, the cleaning liquid 45 flows by forming the liquid film on the casing bottom surface 7b. Thus, required is a less amount of the cleaning liquid 45, so that the amount of the cleaning liquid 45 to be used for cleaning can be reduced.

Further, the liquid film is formed on the casing bottom surface 7b and the cleaning liquid is flown on the casing bottom surface 7b, so that the heat generated by the ultrasonic transducer 15 is efficiently absorbed. Therefore, it is possible to cool down the ultrasonic transducer 15 and to provide stable vibration.

Further, as shown in FIG. 1, FIG. 5, and the like, the cleaning liquid 45 which is discharged from the cleaning liquid discharge part 40 and to which the ultrasonic energy is applied is discharged in a line form along the end part 7a of the casing bottom surface 7b.

It is unnecessary with the ultrasonic cleaning apparatus 1 according to the present invention to discharge the cleaning liquid by providing a slit or the like as in the case of a conventional line shower, so that the structure of the ultrasonic cleaning apparatus 1 can be simplified.

Figure 7A:
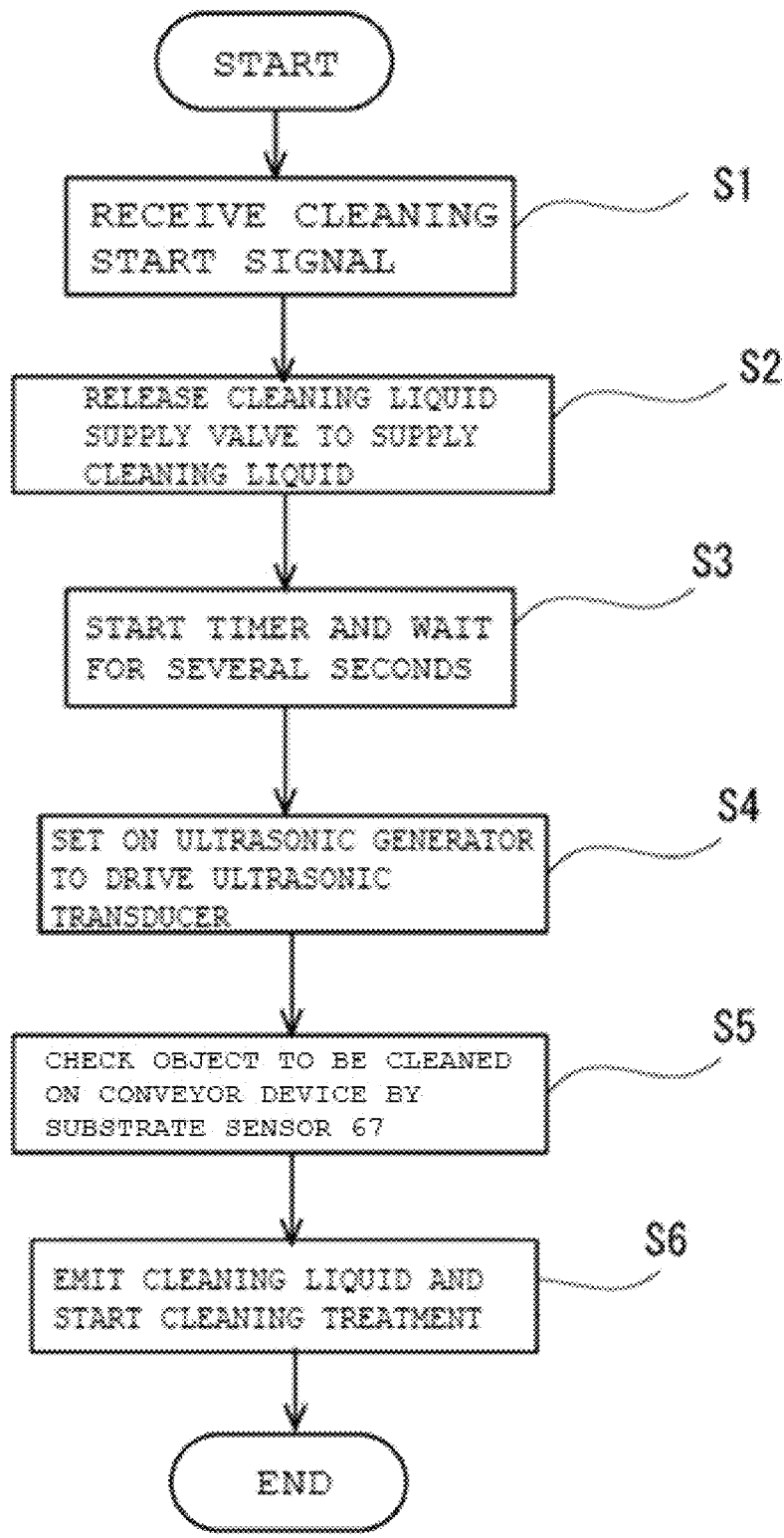
Figure 7B:
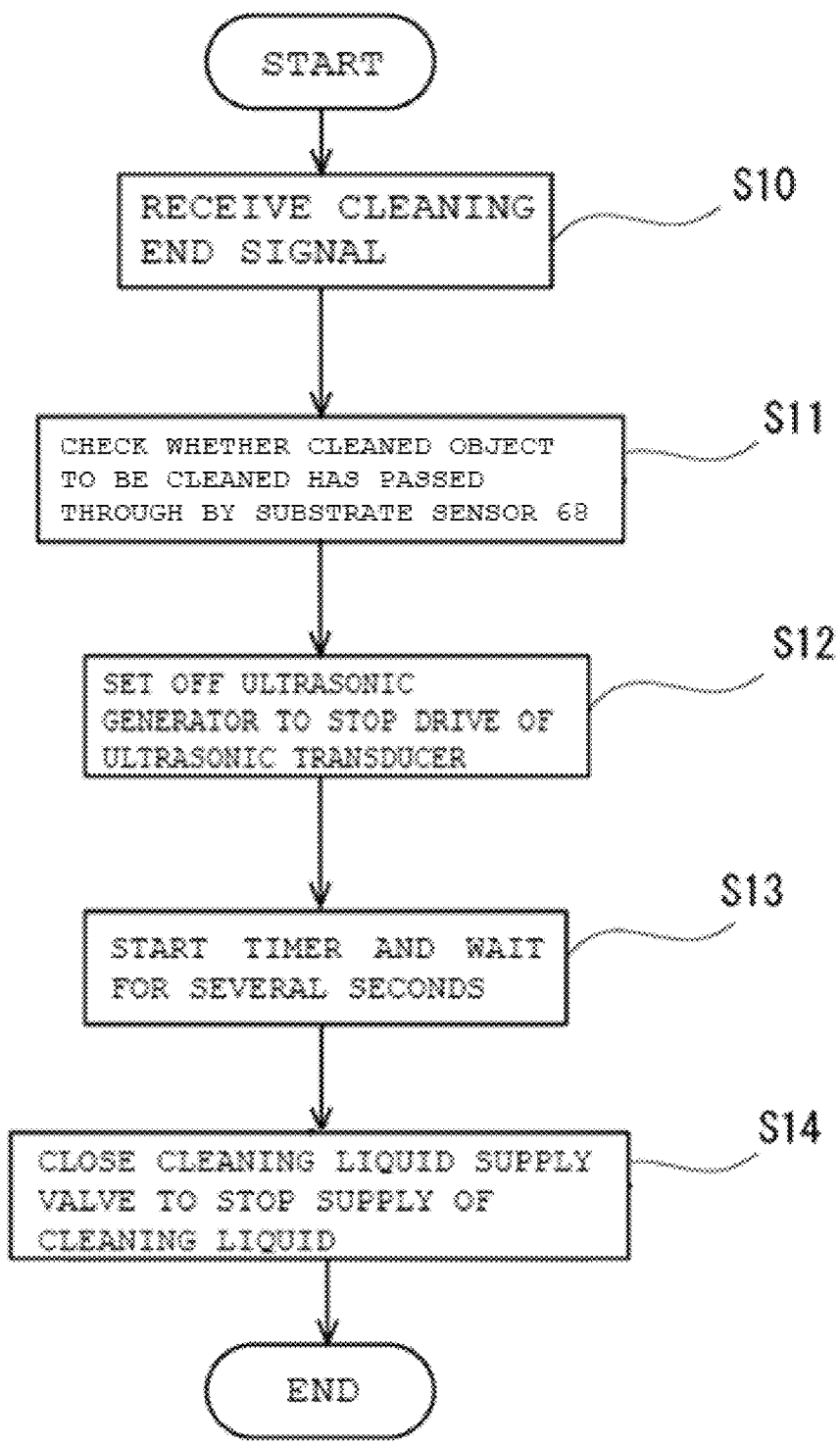

Next, described by referring to FIG. 6 and FIGS. 7A, 7B is an ultrasonic cleaning system in a case of controlling the ultrasonic cleaning apparatus by a cleaning management computer that manages treatment steps. FIG. 6 is a block diagram showing a structure of the ultrasonic cleaning system executed by the cleaning management computer. FIGS. 7A and 7B are flowcharts of the ultrasonic cleaning system when controlled by the cleaning management computer, in which FIG. 7A is a flowchart when starting cleaning treatment and FIG. 7B is a flowchart when ending the cleaning treatment.

As shown in FIG. 6, an ultrasonic cleaning system 80 includes: a cleaning management computer 60 that manages the ultrasonic cleaning apparatus and the like; the ultrasonic cleaning apparatus 1; the ultrasonic generation device 14 that is built in the ultrasonic cleaning apparatus 1 and includes the ultrasonic transducer 15 and the ultrasonic generator 16; the conveyor device 65 that conveys the object to be cleaned 50 such as a glass substrate; and substrate sensors 67 and 68 as detection sensors for detecting existence of the object to be cleaned 50 on the conveyor device 65.

As shown in FIG. 7A, the cleaning management computer 60 receives a cleaning start signal outputted from a higher computer (not shown) that manages steps (step S1 shown in FIG. 7A). The cleaning management computer 60 first sets ON a cleaning liquid supply signal to release a cleaning liquid supply valve 70 as a cleaning liquid supply opening/closing means so that the cleaning liquid 45 from the cleaning liquid tank provided outside is supplied to the ultrasonic cleaning apparatus 1 (step S2). A timer is started and waited for several seconds (step S3). Thereafter, a generation start signal is outputted to the ultrasonic generator 16 of the ultrasonic generation device 14 to drive the ultrasonic transducer 15 of the ultrasonic generation device 14 (step S4). The ultrasonic generator 16 starts operation to start the cleaning treatment of the object to be cleaned 50. Further, it is checked by the substrate sensor 67 whether or not the object to be cleaned 50 is conveyed to the ultrasonic cleaning apparatus 1 by the conveyor device 65 (step S5). The cleaning management computer 60 checks that the object to be cleaned 50 is conveyed to the ultrasonic cleaning apparatus 1 by the conveyor device 65, and discharges the cleaning liquid 45 to the object to be cleaned 50 to perform cleaning treatment (step S6).

As shown in FIG. 7B, in cleaning end treatment by the cleaning management computer 60, the cleaning management computer 60 first receives a cleaning end signal outputted from the higher computer (not shown) that manages the steps (step S10 shown in FIG. 7B). After checking a signal outputted from the substrate sensor 68 indicating that the cleaned object to be cleaned 50 has passed (step S11), a generation stop signal is outputted to the ultrasonic generator 16 to stop the generation action of the ultrasonic generator 16 and stop drive of the ultrasonic transducer 15 (step S12). The timer is started and waited for several seconds (step S13). Thereafter, the cleaning liquid supply valve 70 is closed to stop supply of the cleaning liquid 45, and the cleaning action is ended (step S14).

As described, in the ultrasonic cleaning apparatus 1, the ultrasonic transducer 15 of the ultrasonic generation device 14 is driven after the cleaning liquid 45 is supplied, and cleaning is performed while the cleaning liquid 45 is being supplied. Further, with the ultrasonic cleaning apparatus 1, supply of the cleaning liquid 45 is stopped after stopping the drive of the ultrasonic transducer 15. Therefore, heating without liquid can be prevented.

Described by referring to FIG. 7A are the steps of performing ultrasonic cleaning by sending the signals to the cleaning management computer 60 from the higher computer that manages the steps. However, it is also possible to employ a method with which the higher computer of the cleaning apparatus directly inputs signals of the substrate sensors 67 and 68 to give ultrasonic generation and stop signals to the ultrasonic generator 16 from the higher computer.

Next, a first embodiment of the ultrasonic cleaning apparatus according to the present invention will be described by referring to FIG. 8. FIG. 8 is a sectional view showing the first embodiment of the ultrasonic cleaning apparatus according to the present invention. Note that the structure of the ultrasonic cleaning apparatus shown in FIG. 8 is the same as the structure shown in FIG. 1, so that same reference numerals are applied for providing explanations.

As shown in FIG. 8, in the ultrasonic cleaning apparatus 1, the distance between the upper surface part of the object to be cleaned 50 and the cleaning liquid discharge part 40 is set to be within several mm (millimeters). However, the distance is not limited to such value, and may be selected and set as appropriate.

The cleaning start treatment signal is outputted from the cleaning management computer 60, and the cleaning liquid 45 is supplied from the cleaning liquid supply port 26 of the cleaning liquid supply device 20 in the ultrasonic cleaning apparatus 1. After supplying the cleaning liquid 45, the ultrasonic generator 16 of the ultrasonic generation device 14 supplies an electric power of a prescribed frequency to the ultrasonic transducer 15 to drive the ultrasonic transducer 15.

The ultrasonic transducer 15 of the ultrasonic generation device 14 vibrates and the cleaning liquid 45 whose flow speed is accelerated by the flow-speed accelerator 35 as the flow-speed acceleration part flows on the casing bottom surface 7b. At this point, the cleaning liquid 45 is spread over the whole casing bottom surface 7b due to the ultrasonic vibration of the casing bottom surface 7b, a liquid film is formed on the casing bottom surface 7b, the ultrasonic wave is given to the cleaning liquid 45 flowing on the casing bottom surface 7b to activate the cleaning liquid 45, and the activated cleaning liquid 45 flows on the casing bottom surface 7b and is discharged to the object to be cleaned 50 from the cleaning liquid discharge part 40.

The cleaning liquid 45 discharged from the cleaning liquid discharge part 40 flows on the surface of the object to be cleaned 50, and the liquid film is formed between the surface of the object to be cleaned 50 and the casing bottom surface 7b. This is because the isolated distance between the upper surface part of the object to be cleaned 50 and the casing bottom surface 7b is set to be within several mm (millimeters) and surface tension by the cleaning liquid 45 between the surface of the object to be cleaned 50 and the casing bottom surface 7b is working. As described, the casing bottom surface 7b directly discharges the ultrasonic wave to the object to be cleaned 50 via the cleaning liquid 45. Since the ultrasonic wave is directly discharged to the object to be cleaned 50 via the cleaning liquid 45, a high cleaning effect can be acquired.

Further, supplementation of the cleaning liquid 45 is required only for the cleaning liquid 45 flown onto the casing bottom surface 7b, so that it is unnecessary to supply the cleaning liquid 45 by an exclusively-used cleaning liquid supply device as in the case of the conventional horn type cleaning apparatus. Therefore, the use amount of the cleaning liquid 45 can be reduced greatly.

Further, since the casing bottom surface 7b has the tilted surface with respect to the object to be cleaned 50, the ultrasonic cleaning apparatus 1 is effective not only for the object to be cleaned 50 forming a plane such as a glass substrate but also for a member exhibiting flexibility such as a film.

As shown in FIG. 8, with the first embodiment of the ultrasonic cleaning apparatus, it is possible to perform cleaning treatment on the objects to be cleaned 50 continuously through conveying the objects to be cleaned 50 by the conveyor device 65.

As described, with the first embodiment of the ultrasonic cleaning apparatus 1 according to the present invention, the liquid film is formed between the surface of the object to be cleaned 50 and the casing bottom surface 7b with the cleaning liquid 45 discharged from the cleaning liquid discharge part 40. Thereby, the casing bottom surface 7b directly discharges the ultrasonic wave to the object to be cleaned 50 via the cleaning liquid 45 for achieving the cleaning effect. Thus, the ultrasonic cleaning apparatus 1 according to the present invention is capable of performing horn type cleaning.

Figure 9:
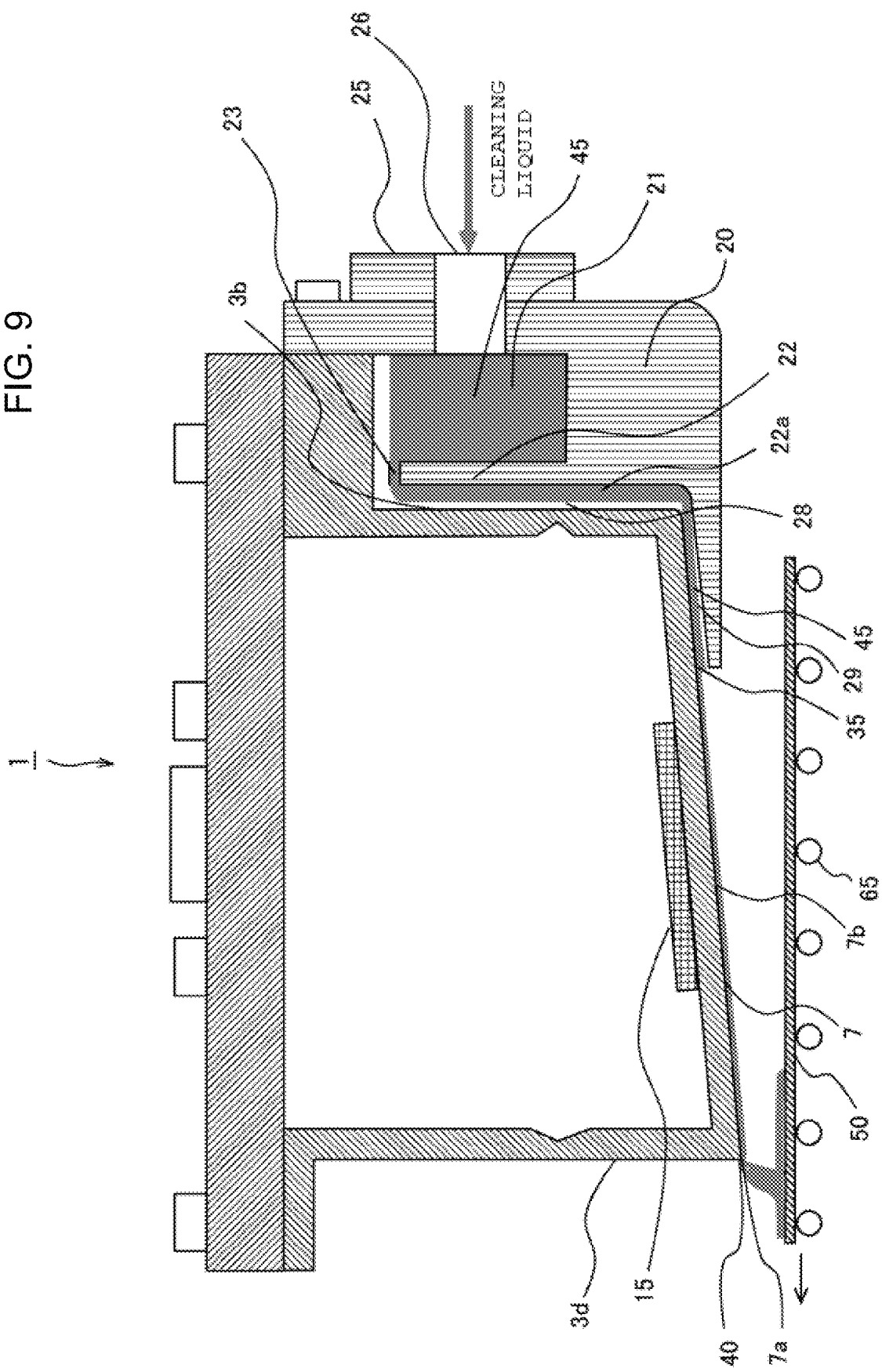
FIG. 9 is a sectional view showing a second embodiment of the ultrasonic cleaning apparatus according to the present invention.

Next, a second embodiment of the ultrasonic cleaning apparatus according to the present invention will be described by referring to FIG. 9. FIG. 9 is a sectional view showing the second embodiment of the ultrasonic cleaning apparatus according to the present invention. Note that the structure of the ultrasonic cleaning apparatus shown in FIG. 9 is the same as the structure shown in FIG. 1, so that same reference numerals are applied for providing explanations.

As shown in FIG. 9, the cleaning liquid 45 is supplied from the cleaning liquid supply port 26 of the cleaning liquid supply device 20 in the ultrasonic cleaning apparatus 1. After supplying the cleaning liquid 45, the ultrasonic generator 16 of the ultrasonic generation device 14 supplies an electric power of a prescribed frequency to the ultrasonic transducer 15 to drive the ultrasonic transducer 15.

The ultrasonic transducer 15 of the ultrasonic generation device 14 vibrates and the cleaning liquid 45 whose flow speed is accelerated by the flow-speed accelerator 35 as the flow-speed acceleration part flows on the casing bottom surface 7b. At this point, the cleaning liquid 45 is spread over the whole casing bottom surface 7b due to the vibration of the casing bottom surface 7b, a liquid film is formed on the casing bottom surface 7b, the ultrasonic wave is given to the cleaning liquid 45 flowing on the casing bottom surface 7b to activate the cleaning liquid 45, and the activated cleaning liquid 45 flows on the casing bottom surface 7b and is discharged to the object to be cleaned 50 from the cleaning liquid discharge part 40.

The cleaning liquid discharge part 40 is located at the end part 7a of the casing bottom surface at which the casing bottom surface 7b intersects with the outer lateral face 3d of the casing 3. Thereby, the cleaning liquid 45 discharged from the cleaning liquid discharge part 40 is discharged to the surface of the object to be cleaned 50 in a line form. The cleaning liquid 45 discharged to the surface of the object to be cleaned 50 includes the ultrasonic energy, and is effective for removing particles on the surface of the object to be cleaned 50.

With the second embodiment, the cleaning liquid 45 is discharged in a line form. Thus, cleaning is performed by moving the cleaning liquid discharge part 40 discharging the cleaning liquid 45 and the object to be cleaned 50 so that the cleaning liquid 45 is discharged over the whole surface of the object to be cleaned 50. For example, the conveyor device 65 for conveying the object to be cleaned 50 is provided, the cleaning liquid discharge part 40 is disposed on the conveying path of the conveyor device 65, and the object to be cleaned 50 is conveyed by the conveyor device 65. Meanwhile, it is also possible to move the ultrasonic cleaning apparatus 1 over the object to be cleaned 50 by a conveyor device, not shown.

As described above, through discharging the cleaning liquid 45 to which the ultrasonic energy is applied by the casing bottom surface 7b to the object to be cleaned 50, the cleaning effect can be achieved.

Further, supplementation of the cleaning liquid 45 is required only for the cleaning liquid 45 flown onto the casing bottom surface 7b, so that the use amount of the cleaning liquid 45 can be reduced greatly.

Further, since the casing bottom surface 7b has the tilted surface with respect to the object to be cleaned 50, the cleaning liquid 45 can be smoothly flown on the casing bottom surface 7b in the ultrasonic cleaning apparatus 1.

As described, in the second embodiment of the ultrasonic cleaning apparatus according to the present invention, the cleaning liquid 45 is discharged from the cleaning liquid discharge part 40 onto the surface of the object to be cleaned 50 in a line form by the end part 7a of the casing bottom surface. The cleaning liquid 45 discharged onto the surface of the object to be cleaned 50 includes the ultrasonic energy, and is effective for removing the particles on the surface of the object to be cleaned 50. Further, through moving the object to be cleaned 50 by the conveyor device 65 to pass the position of the cleaning liquid discharge part 40, it becomes possible to clean the whole surface of a large-sized object to be cleaned. Therefore, the ultrasonic cleaning apparatus 1 according to the present invention is capable of performing line shower type cleaning.

Further, the casing bottom surface 7b is provided by being tilted with respect to the object to be cleaned 50 and the ultrasonic transducer 15 is also provided along the tilt, so that the ultrasonic cleaning apparatus 1 according to the present invention is effective not only for the object to be cleaned 50 forming a plane such as a glass substrate but also for a member exhibiting flexibility such as a film.

Next, a third embodiment of the ultrasonic cleaning apparatus according to the present invention will be described by referring to FIG. 10.

The third embodiment of the ultrasonic cleaning apparatus 1 is designed to provide a cleaning liquid adjustment plate between the cleaning liquid discharge part 40 and the object to be cleaned 50. FIG. 10 is a sectional view showing the third embodiment of the ultrasonic cleaning apparatus according to the present invention. Note that the structure of the ultrasonic cleaning apparatus shown in FIG. 10 is the same as the structure shown in FIG. 1, so that same reference numerals are applied for providing explanations.

As shown in FIG. 10, in the ultrasonic cleaning apparatus 1, the cleaning liquid 45 is discharged from the cleaning liquid discharge part 40 to a cleaning liquid adjustment plate 45, and a liquid film is formed between the cleaning liquid adjustment plate 43 and the object to be cleaned 50 with the discharged cleaning liquid 45.

In the third embodiment, the isolated distance between the object to be cleaned 50 and the cleaning liquid adjustment plate 43 is set to be about 3 to 5 mm, and the object to be cleaned 50 such as a substrate is conveyed by the conveyor device 65 to pass along the conveying direction shown with an arrow to form a liquid film between the object to be cleaned 50 and the cleaning liquid adjustment plate 43 by action of surface tension. The ultrasonic wave from the cleaning liquid adjustment plate 43 is transmitted to the object to be cleaned 50 via the formed liquid film.

Further, a plurality of small holes (not shown) are formed in the cleaning liquid adjustment plate 43. Those small holes are not only for transmitting the ultrasonic wave from the ultrasonic transducer 15 of the ultrasonic generation device 14 but also for functioning as liquid adjusting means for adjusting the discharge amount of the cleaning liquid 45.

The small holes may secure the discharge amount capable of forming the liquid film between with the object to be cleaned 50 and may be able to form the liquid film capable of discharging a uniform discharge amount of an appropriate amount to the surface of the object to be cleaned 50. The discharge amount can be adjusted depending on the size, shape, the number of the small holes, and the like, so that it is possible to save the liquid compared to that of the conventional ultrasonic cleaning apparatus.

As described, in the third embodiment of the ultrasonic cleaning apparatus according to the present invention, the cleaning liquid adjustment plate 43 is provided between the cleaning liquid discharge part 40 and the object to be cleaned 50, the liquid film is formed between the object to be cleaned 50 and the cleaning liquid adjustment plate 43 by the action of the surface tension, and the ultrasonic wave from the cleaning liquid adjustment plate 43 is transmitted to the object to be cleaned 50 via the formed liquid film. Further, the small holes of the cleaning liquid adjustment plate 43 are not only for transmitting the ultrasonic wave from the ultrasonic transducer 15 of the ultrasonic generation device 14 but also for functioning as the liquid adjusting means for adjusting the discharge amount of the cleaning liquid 45.

As described above, according to the present invention, provided is the flow-speed accelerator as the flow-speed acceleration part having the ejection port for ejecting the cleaning liquid from the cleaning liquid supply device to the casing bottom surface by accelerating the flow speed, and the cleaning liquid ejected from the flow-speed accelerator as the flow-speed acceleration part is spread by the vibration of the bottom surface, and flown on the tilted surface of the casing bottom surface to form the liquid film on the casing bottom surface. One surface of the liquid film of the cleaning liquid is in contact with the casing bottom surface while the other surface of the liquid film of the cleaning liquid is in contact with the air or the surface of the object to be cleaned, and the cleaning liquid flown on the casing bottom surface is discharged to the object to be cleaned located underneath. Thereby, the liquid film of the cleaning liquid is formed continuously on the casing bottom surface even when there is no object to be cleaned, thereby making a state where the casing bottom surface is in contact with the cleaning liquid at all times. Therefore, heating without liquid as a cause for breakdown can be prevented.

Further, according to the present invention, the cleaning liquid is spread by the vibration of the bottom surface, flown on the tilted surface of the casing bottom surface to form the liquid film on the casing bottom surface, and the cleaning liquid flown on the casing bottom surface is discharged to the object to be cleaned located underneath. Therefore, it is possible to save the cleaning liquid by greatly reducing the cleaning liquid.

Further, the liquid film is formed on the casing bottom surface, and the heat generated by the ultrasonic transducer is efficiently absorbed with running water on the casing bottom surface. Therefore, it is possible to cool down the ultrasonic transducer and to provide stable vibration.

Further, according to the present invention, the supplied cleaning liquid is stored in the cleaning liquid storage tank, and the cleaning liquid overflown and rectified by the overflow rectifier is used. Thus, the supplied cleaning liquid is not directly discharged to the ultrasonic transducer and the object to be cleaned unlike the conventional case, so that the cleaning liquid can be flown uniformly. In addition, mixture and generation of bubbles can be reduced by using the overflown cleaning liquid, so that stable cleaning can be performed.

A single ultrasonic cleaning apparatus according to the invention has functions of spot shower type and horn type, so that the cleaning apparatus can be selectively used depending on the cleaning mode. That is, through placing the object to be cleaned close to the cleaning liquid discharge part, a liquid film is formed between the object to be cleaned and the casing bottom surface with the cleaning liquid discharged from the cleaning liquid discharge part. Therefore, a similar structure as that of the horn type can be achieved, and a high cleaning effect can be acquired.

Further, when the conventional horn type is placed in parallel to the object to be cleaned, the ultrasonic energy by reflection is concentrated on the ultrasonic transducer. Thus, the ultrasonic transducer is likely to be influenced by the reflection of the ultrasonic wave, so that a risk of having breakdown is increased. According to the present invention, the casing bottom surface is located on an upper side by being isolated from the object to be cleaned and provided to oppose to the object to be cleaned in a tilted manner, so that it is possible to lighten cleaning unevenness generated by ultrasonic wavelengths depending on the distance from the casing bottom surface to the object to be cleaned. Further, through giving an angle to the casing bottom surface with respect to the object to be cleaned, concentration of the ultrasonic energy to a specific point of the ultrasonic transducer by reflection can be prevented so that the risk of having breakdown in the ultrasonic transducer can be reduced.

Further, according to the present invention, the vibration cut-off body for cutting off ultrasonic vibration is provided to the casing. Therefore, it is possible to give the ultrasonic energy to the cleaning liquid and the object to be cleaned efficiently through suppressing vibration at the area of the casing upper part and the like not contributing to cleaning.

In addition, according to the present invention, the cleaning liquid activated by the ultrasonic wave is discharged in a line form from the end part of the casing bottom surface. Thus, it is unnecessary to discharge the cleaning liquid by proving a slit or the like as in the case of the conventional line shower, so that the structure of the ultrasonic cleaning apparatus can be simplified.

Further, according to the present invention, the cleaning width keeping cleaning uniformity can be acquired in the lateral width direction to which the cleaning liquid is ejected. Thus, through discharging the cleaning liquid in a line form from the end part of the casing bottom surface, it is possible to deal with increase in the size of the objects to be cleaned.

In addition, according to the present invention, the cleaning width keeping cleaning uniformity can be acquired in the lateral width direction to which the cleaning liquid is ejected. Thus, through discharging the cleaning liquid from the casing bottom surface to the surface of the object to be cleaned in contact with the surface of the object to be cleaned via the cleaning liquid, it is possible to deal with increase in the size of the objects to be cleaned.

Furthermore, the casing bottom surface is provided to oppose to the object to be cleaned in a tilted manner, so that the ultrasonic cleaning apparatus is effective not only for the object to be cleaned forming a plane such as a glass substrate but also for a member exhibiting flexibility such as a film.

Further, with the first embodiment of the ultrasonic cleaning apparatus 1 according to the present invention, the liquid film is formed between the surface of the object to be cleaned 50 and the casing bottom surface 7b with the cleaning liquid discharged from the cleaning liquid discharge part 40. Thereby, the casing bottom surface 7b directly discharges the ultrasonic wave to the object to be cleaned 50 via the cleaning liquid for achieving the cleaning effect. Thus, the ultrasonic cleaning apparatus 1 according to the present invention is capable of performing horn type cleaning.

Further, in the second embodiment of the ultrasonic cleaning apparatus according to the present invention, the cleaning liquid discharged from the cleaning liquid discharge part 40 is discharged onto the surface of the object to be cleaned 50 in a line form by the casing bottom surface. Thus, the cleaning liquid discharged onto the surface of the object to be cleaned 50 includes the ultrasonic energy, and is effective for removing the particles on the surface of the object to be cleaned 50. Further, through moving the object to be cleaned 50 by the conveyor device 65 over the cleaning liquid discharge part 40, it becomes possible to clean the whole surface of a large-sized object to be cleaned.

Furthermore, in the third embodiment of the ultrasonic cleaning apparatus according to the present invention, the cleaning liquid adjustment plate 43 is provided between the cleaning liquid discharge part 40 and the object to be cleaned 50, the liquid film is formed between the object to be cleaned 50 and the cleaning liquid adjustment plate 43 by the action of the surface tension, and the ultrasonic wave from the cleaning liquid adjustment plate 43 is transmitted to the object to be cleaned 50 via the formed liquid film. Further, the small holes of the cleaning liquid adjustment plate 43 are not only for transmitting the ultrasonic wave from the ultrasonic transducer 15 of the ultrasonic generation device 14 but also for functioning as the liquid adjusting means for adjusting the discharge amount of the cleaning liquid.

The present invention can be embodied in a number of forms without departing from the essential characteristics thereof. It is therefore to be understood that the embodiments described above are only for description, and are not intended to limit the present invention.

What is claimed is:

1. An ultrasonic cleaning apparatus, comprising:
a casing having a bottom wall;
an ultrasonic transducer provided on an inner surface of the bottom wall and which applies ultrasonic vibration to the bottom wall;
a flow-speed acceleration part having an overflow rectifier, a cleaning liquid introduction member opposing a tilted portion of an outer surface of the bottom wall, and a cleaning liquid introduction path formed between the cleaning liquid introduction member and the tilted portion; wherein:
the flow-speed acceleration part is configured to form a liquid film on the outer surface through accelerating a flow speed of cleaning liquid from the overflow rectifier and through the cleaning liquid introduction path, and through flowing the cleaning liquid along the outer surface by ejecting the cleaning liquid from one end side of the outer surface toward an other end side of the outer surface; and
the other end side of the outer surface is configured to discharge the cleaning liquid flowing on the outer surface toward an object to be cleaned located underneath the outer surface.

2. The ultrasonic cleaning apparatus according to claim 1, wherein the tilted portion is tilted by a prescribed angle with respect to a horizontal plane so that the one end side is positioned at an upper side than the other end side.

3. The ultrasonic cleaning apparatus according to claim 2, wherein the tilted portion is tilted within a range of 1° to 45° with respect to the horizontal plane.

4. The ultrasonic cleaning apparatus according to claim 1, wherein notches are provided at a prescribed interval in an upper end of the overflow rectifier in a longitudinal direction.

5. The ultrasonic cleaning apparatus according to claim 1, wherein:
an ejection port is provided between the outer surface and the cleaning liquid introduction member; and
the flow-speed acceleration part is configured to accelerate the flow speed of the cleaning liquid ejected from the ejection port.

6. The ultrasonic cleaning apparatus according to claim 1, further comprising a conveyor device configured to convey the object to be cleaned, wherein
the other end side of the outer surface is disposed on a conveying path of the conveyor device.

7. The ultrasonic cleaning apparatus according to claim 1, wherein the casing comprises a lateral face, and the lateral face is provided with a notch to cut off ultrasonic vibration.

* * * * *